(12) United States Patent
Kim et al.

(10) Patent No.: US 11,758,777 B2
(45) Date of Patent: Sep. 12, 2023

(54) FLEXIBLE DISPLAY DEVICE INCLUDING CONNECTION MEMBER DISPOSED ON BUFFER LAYER

(71) Applicant: LG Display Co., Ltd., Seoul (KR)

(72) Inventors: Jaehyeong Kim, Seoul (KR); JaeSung Lee, Sejong (KR); Dojin Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 301 days.

(21) Appl. No.: 17/060,370

(22) Filed: Oct. 1, 2020

(65) Prior Publication Data
US 2021/0134931 A1 May 6, 2021

(30) Foreign Application Priority Data

Nov. 4, 2019 (KR) .................. 10-2019-0139419

(51) Int. Cl.
| | |
|---|---|
| H01L 27/32 | (2006.01) |
| H01L 51/00 | (2006.01) |
| G02F 1/133 | (2006.01) |
| G09F 9/30 | (2006.01) |
| H01L 51/52 | (2006.01) |
| G02F 1/1333 | (2006.01) |

(52) U.S. Cl.
CPC ...... H01L 27/3276 (2013.01); H01L 27/3272 (2013.01); *G02F 1/133305* (2013.01); *H01L 51/0097* (2013.01); *H01L 51/5253* (2013.01); *H01L 2251/5338* (2013.01)

(58) Field of Classification Search
CPC ............ H01L 27/3276; H01L 27/3272; H01L 27/3248; H01L 27/3262; H01L 27/3279; H01L 27/32; H01L 51/0097; H01L 2251/5338; G02F 1/133305; G02F 2001/133357; G09F 9/301
See application file for complete search history.

(56) References Cited

U.S. PATENT DOCUMENTS

| 10,777,629 B2 * | 9/2020 | Kwon ................. H01L 27/3258 |
| 2019/0131365 A1 * | 5/2019 | Jung .................. H01L 27/3262 |
| 2019/0245016 A1 | 8/2019 | Lee et al. |

(Continued)

FOREIGN PATENT DOCUMENTS

| KR | 10-2019-0066805 A | 6/2019 |
| KR | 10-2019-0096468 A | 8/2019 |

*Primary Examiner* — Ida M Soward
(74) *Attorney, Agent, or Firm* — Morgan, Lewis & Bockius LLP

(57) ABSTRACT

A flexible display device according to an exemplary embodiment of the present disclosure may include a substrate divided into a display area and a non-display area; a first buffer layer disposed on the substrate; a second buffer layer disposed under the substrate; a support member disposed under the second buffer layer; a transistor and a light emitting element disposed above the first buffer layer in the display area; a conductive layer disposed in the second buffer layer in the non-display area; and a connection member disposed on the first buffer layer in the non-display area and electrically connected to the conductive layer through a contact hole, so that an effect of minimizing luminance unevenness of a display panel due to the use of a polyimide (PI) substrate by grounding and removing charges accumulated in the PI substrate, can be provided.

18 Claims, 15 Drawing Sheets

(56) References Cited

U.S. PATENT DOCUMENTS

| | | | |
|---|---|---|---|
| 2020/0035950 A1* | 1/2020 | Seo | H01L 51/5271 |
| 2020/0052051 A1* | 2/2020 | Lee | H01L 27/1248 |
| 2020/0106045 A1* | 4/2020 | Han | H01L 27/3234 |
| 2020/0176538 A1* | 6/2020 | Um | H01L 51/5237 |
| 2020/0176709 A1* | 6/2020 | Moon | G06F 3/0412 |
| 2021/0135155 A1* | 5/2021 | Xu | H01L 51/5246 |
| 2021/0184139 A1* | 6/2021 | Zhang | H01L 27/1218 |
| 2021/0225893 A1* | 7/2021 | Yang | H01L 27/1237 |
| 2021/0234122 A1* | 7/2021 | Choi | H01L 51/56 |
| 2021/0408190 A1* | 12/2021 | Yang | H01L 27/3262 |

* cited by examiner

FLEXIBLE DISPLAY DEVICE INCLUDING CONNECTION MEMBER DISPOSED ON BUFFER LAYER

CROSS-REFERENCE TO RELATED APPLICATIONS

This application claims the priority benefit of Korean Patent Application No. 10-2019-0139419 filed on Nov. 4, 2019, with the Korean Intellectual Property Office, the disclosure of which is incorporated herein by reference.

BACKGROUND

Technical Field

The present disclosure relates to a flexible display device and more particularly, to a flexible display device using a flexible substrate.

Discussion of the Related Art

Recently, as society advances toward an information-oriented society, the field of display devices for visually expressing electrical information signals has rapidly advanced. Various display devices, having excellent performance in terms of thinness, weight reduction, and low power consumption, are being developed correspondingly.

Representative display devices may include a liquid crystal display device (LCD), a field emission display device (FED), an electro-wetting display device (EWD), an organic light emitting display device (OLED), and the like.

An electroluminescent display device represented by an organic light emitting display device is a self-light emitting display device, and may be manufactured to be light and thin since it does not require a separate light source, unlike a liquid crystal display device having a separate light source. In addition, the electroluminescent display device has advantages in terms of power consumption due to a low voltage driving, and is excellent in terms of a color implementation, a response speed, a viewing angle, and a contrast ratio (CR). Therefore, electroluminescent display devices are expected to be utilized in various fields.

In the electroluminescent display device, an emissive layer (EML) is disposed between two electrodes formed of an anode and a cathode. When holes from the anode are injected into the emissive layer and electrons from the cathode are injected into the emissive layer, the injected electrons and holes recombine with each other to form excitons in the emissive layer and emit light.

A host material and a dopant material are included in the emissive layer and interact with each other. A host generates excitons from the electrons and holes and transfers energy to a dopant. The dopant is a dye-based organic material that is added in a small amount, and receives the energy from the host to convert it into light.

The electroluminescent display device is encapsulated with glass, metal, or film to block the introduction of moisture or oxygen from the outside to the interior of the electroluminescent display device, thereby preventing oxidation of the emissive layer or the electrode and protecting it from external mechanical or physical impacts.

Meanwhile, recently, a flexible display device manufactured to be able to display an image even when the display device is rolled, by forming a display element, lines and the like on a flexible substrate, such as plastic which is a flexible material, has received considerable attraction as a next-generation display device.

SUMMARY

Accordingly, embodiments of the present disclosure are directed to a flexible display device that substantially obviates one or more of the problems due to limitations and disadvantages of the related art.

An aspect of the present disclosure is to provide a flexible display device in which luminance unevenness due to the use of a polyimide (PI) substrate is minimized.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a flexible display device may comprise: a substrate divided into a display area and a non-display area; a first buffer layer disposed on the substrate; a second buffer layer disposed under the substrate; a support member disposed under the second buffer layer; a transistor and a light emitting element disposed above the first buffer layer in the display area; a conductive layer disposed in the second buffer layer in the non-display area; and a connection member disposed on the first buffer layer in the non-display area and electrically connected to the conductive layer through a contact hole.

In another aspect, a flexible display device may comprise: a substrate divided into a display area and a non-display area; a first buffer layer disposed on the substrate; a second buffer layer disposed under the substrate; a support member disposed under the second buffer layer; a transistor and a light emitting element disposed above the first buffer layer in the display area; a conductive layer disposed in the second buffer layer in the non-display area; and a connection member connected to the conductive layer through a contact hole, wherein the substrate is made of polyimide, and the connection member removes charges accumulated in the substrate of polyimide through ground.

Other detailed matters of the exemplary embodiments are included in the detailed description and the drawings.

The flexible display device according to an exemplary embodiment of the present disclosure provides an effect of minimizing luminance unevenness of a display panel due to the use of a polyimide (PI) substrate by grounding and removing charges accumulated in the PI substrate.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
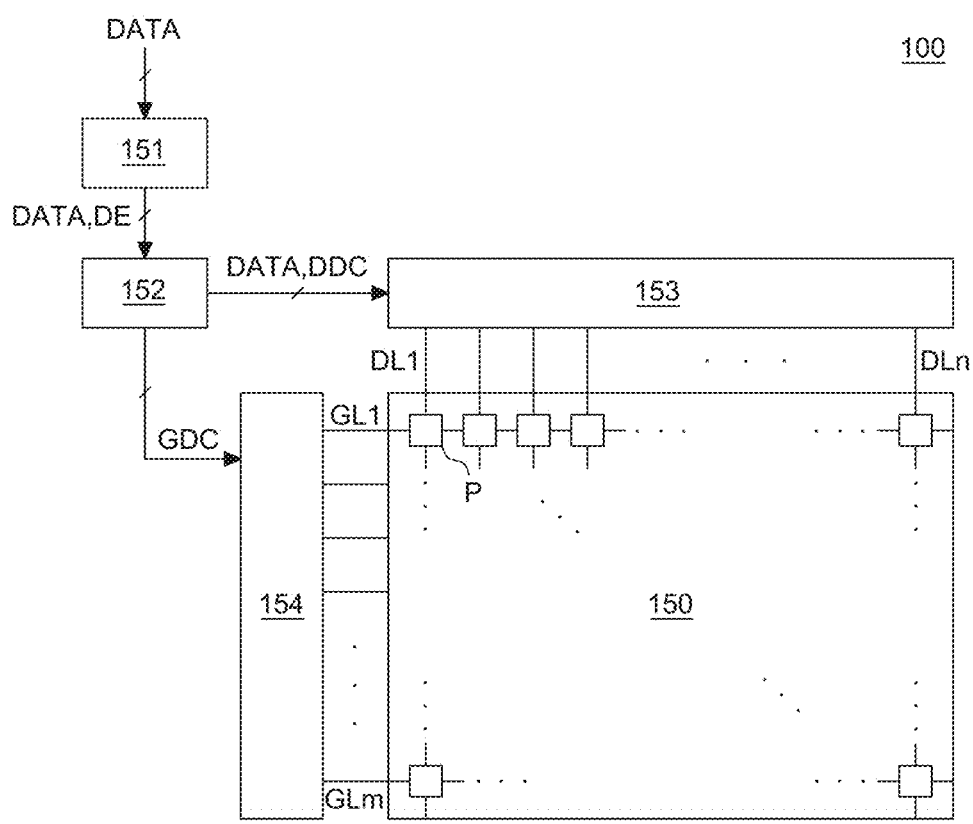
FIG. 1 is a block diagram of a flexible display device according to a first exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a flexible display device according to exemplary embodiments of the present disclosure will be described in detail with reference to accompanying drawings.

FIG. 1 is a block diagram of a flexible display device according to a first exemplary embodiment of the present disclosure.

With reference to FIG. 1, a flexible display device 100 according to the first exemplary embodiment of the present disclosure may include an image processor 151, a timing controller 152, a data driver 153, a gate driver 154, and a display panel 150.

The image processor 151 may output a data signal DATA and a data enable signal DE through a data signal DATA that are supplied from the outside.

The image processor 151 may output one or more of a vertical synchronization signal, a horizontal synchronization signal, and a clock signal, in addition to the data enable signal DE.

The timing controller 152 receives the data enable signal DE or the data signal DATA, together with driving signals including the vertical synchronization signal, the horizontal synchronization signal, the clock signal and the like, from the image processor 151. The timing controller 152 may outputs a gate timing control signal GDC for controlling an operational timing of the gate driver 154 and a data timing control signal DDC for controlling an operational timing of the data driver 153 based on the driving signals.

The data driver 153 samples and latches the data signal DATA supplied from the timing controller 152 in response to the data timing control signal DDC supplied from the timing controller 152, and converts the data signal DATA into a gamma reference voltage to output it. The data driver 153 may output the data signal DATA through data lines DL1 to DLn.

The gate driver 154 may output a gate signal while shifting a level of a gate voltage in response to the gate timing control signal GDC supplied from the timing controller 152.

The gate driver 154 may output the gate signal through gate lines GL1 to GLm.

The display panel 150 may display an image while a sub-pixel P emits light in response to the data signal DATA and the gate signal supplied from the data driver 153 and the gate driver 154. A detailed structure of the sub-pixel P will be described in detail in FIGS. 2 and 4.

Figure 2:
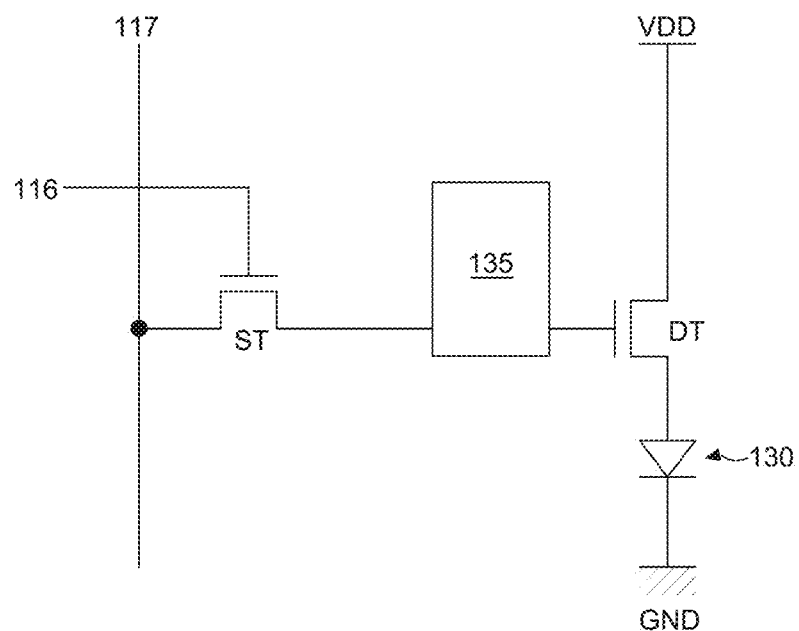
FIG. 2 is a circuit diagram of a sub-pixel included in the flexible display device according to the first exemplary embodiment of the present disclosure.

FIG. 2 is a circuit diagram of a sub-pixel included in the flexible display device according to the first exemplary embodiment of the present disclosure.

With reference to FIG. 2, the sub-pixel P of the flexible display device 100 according to the first exemplary embodiment of the present disclosure may include a switching transistor ST, a driving transistor DT, a compensation circuit 135, and a light emitting element 130.

The light emitting element 130 may operate to emit light according to a driving current formed by the driving transistor DT.

The switching transistor ST may perform a switching operation such that a data signal supplied through a data line 117 is stored as a data voltage in a capacitor in response to a gate signal supplied through a gate line 116.

The driving transistor DT may operate such that a constant driving current flows between a high-potential power supply line VDD and a low-potential power supply line GND in response to the data voltage stored in the capacitor.

The compensation circuit 135 is a circuit for compensating for a threshold voltage or the like of the driving transistor DT, and the compensation circuit 135 may include one or more transistors and capacitors. A configuration of the compensation circuit 135 may vary according to a compensation method.

For example, the sub-pixel shown in FIG. 2 is configured to have a structure of 2T (Transistor) 1C (Capacitor) including the switching transistor ST, the driving transistor DT, a capacitor, and the light emitting element 130. However, the sub-pixel may have a variety of structures, such as 3T1C, 4T2C, 5T2C, 6T1C, 6T2C, 7T1C, 7T2C, and the like when the compensation circuit 135 is added thereto.

Meanwhile, the present disclosure is characterized by forming a doped layer (or a conductive layer) in a lower buffer layer in an edge area of the display panel and connecting the doped layer to the low-potential power supply line GND through a contact hole, in order to remove charges accumulated in a flexible substrate of polyimide (PI) in the edge area of the display panel.

Rollable display devices, and flexible display devices such as bezel-bendable display devices in which a bezel area is bent, and the like may use polyimide as a flexible substrate.

The rollable display devices may be referred to as display devices capable of displaying an image even when they are rolled.

In the case of the flexible display device using polyimide as a flexible substrate, when a positive bias stress is applied to a transistor, a large amount of charges accumulates in the polyimide substrate, which affects a driving of the display panel. That is, when a positive bias stress is applied to a gate electrode of the transistor, negative charges are accumulated in a channel region, and positive charges are accumulated in the polyimide substrate under the transistor. When the display panel is driven, charges are accumulated in an edge area of the display panel since configurations of a GIP circuit unit and the transistor in a display area are different.

Accordingly, a luminance defect in which luminance increases along the edge area of the display panel occurs.

Therefore, the present disclosure is characterized by doping a portion of a second buffer layer (making a portion of a second buffer layer conductive) under the polyimide substrate in the edge area of the display panel to form a doped layer (or a conductive layer) as a discharge area, and connecting (grounding) the doped layer to the low-potential power supply line (GND) through a contact hole, thereby minimizing luminance unevenness of the display panel due to the use of the polyimide substrate.

Figure 3:
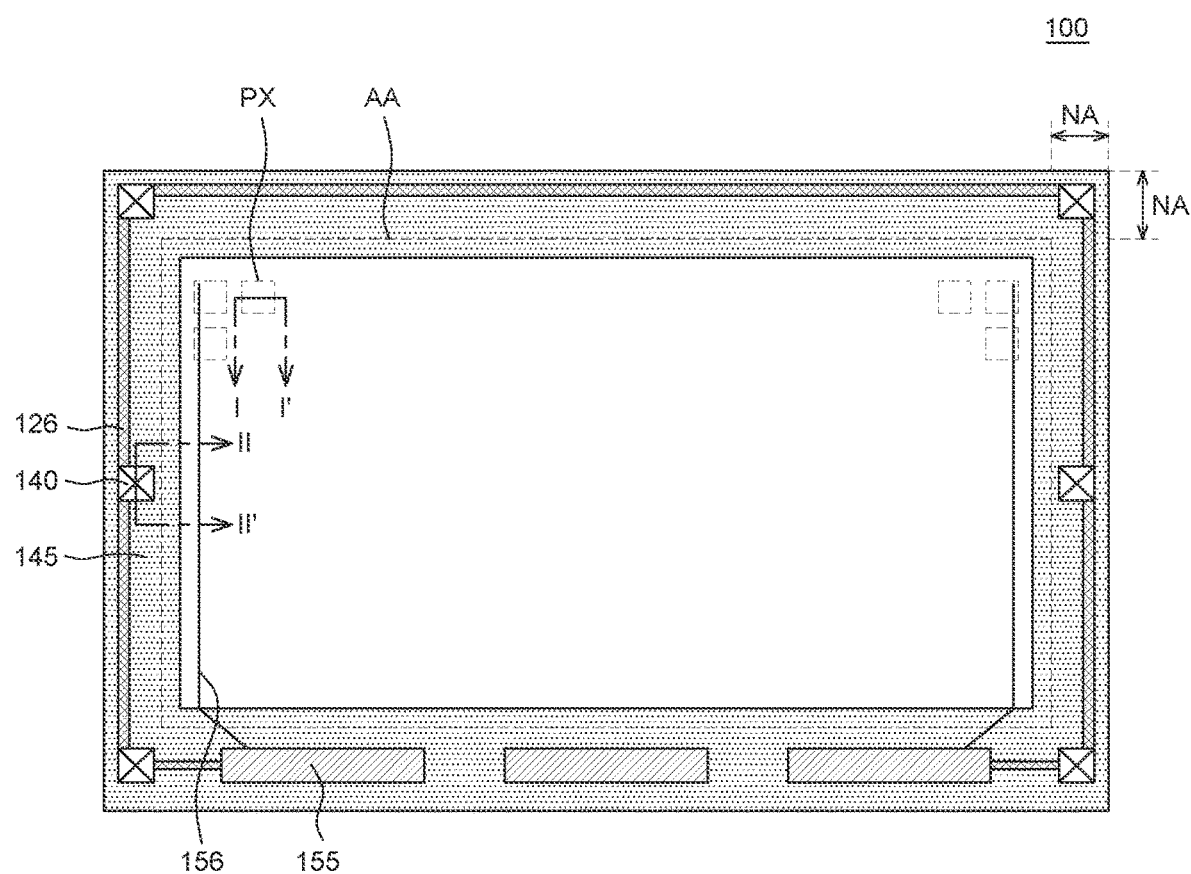
FIG. 3 is a plan view of the flexible display device according to the first exemplary embodiment of the present disclosure.

FIG. 3 is a plan view of the flexible display device according to the first exemplary embodiment of the present disclosure.

Figure 4:
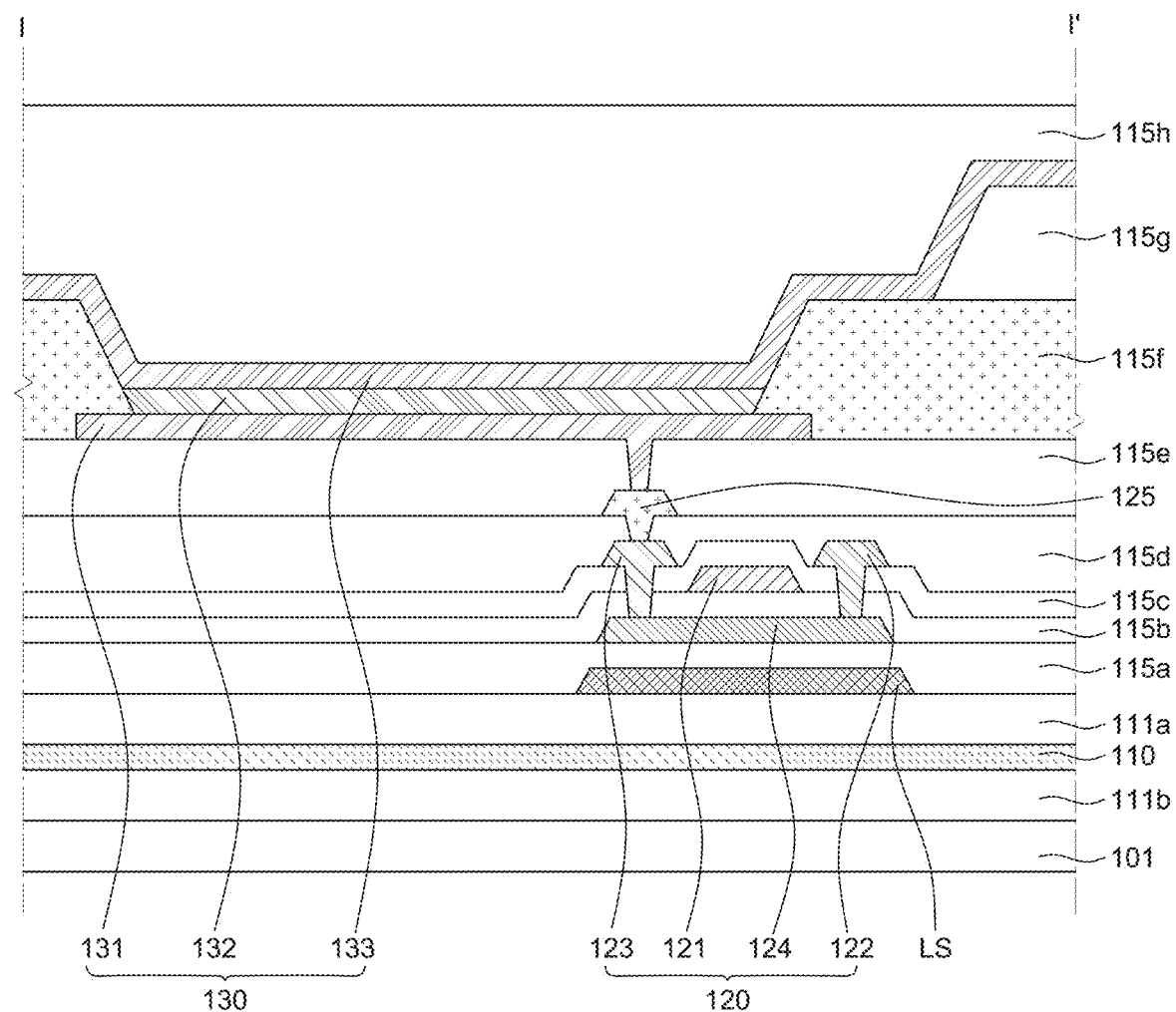
FIG. 4 is a cross-sectional view taken along line I-I' of FIG. 3.

FIG. 4 is a cross-sectional view taken along line I-I' of FIG. 3.

Figure 5:
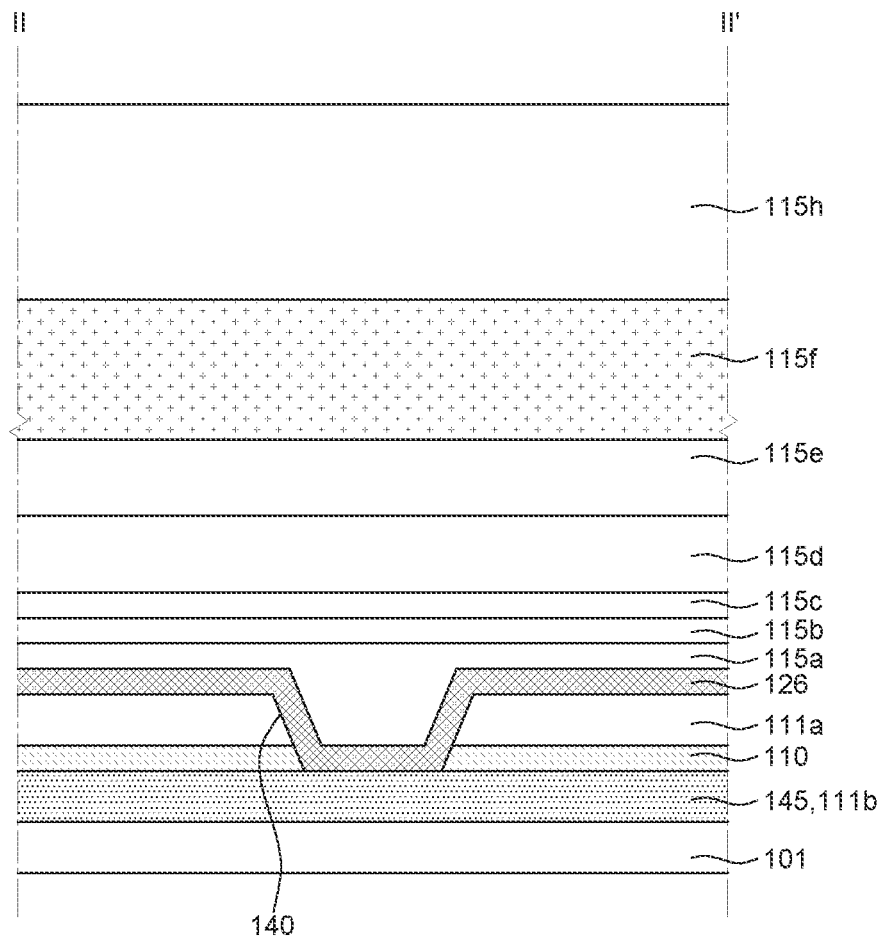
FIG. 5 is a cross-sectional view taken along line II-II' of FIG. 3.

FIG. 5 is a cross-sectional view taken along line II-II' of FIG. 3.

FIG. 4 is a cross-sectional view showing a detailed structure of a display area illustrated in FIG. 3, and FIG. 5 is a cross-sectional view showing a detailed structure of a non-display area NA illustrated in FIG. 3.

With reference to FIG. 3, the flexible display device 100 according to the first exemplary embodiment of the present disclosure includes a display area AA and a non-display area NA.

For convenience, the non-display area NA may be defined as an area excluding the display area AA.

The display area AA may be disposed in the center of the display panel, and may be an area where an image is displayed in the flexible display device 100.

Display elements and various driving elements for driving the display elements may be disposed in the display area AA. For example, the display element may be configured of a light emitting element including a first electrode, a light emitting layer, and a second electrode, which will be described later. In addition, various driving elements such as transistors, capacitors, and lines for driving the display elements may be disposed in the display area AA.

The display area AA may include a plurality of sub-pixels PX.

The sub-pixel PX is a minimum unit constituting a screen, and each of the plurality of sub-pixels PX may include the light emitting element and the driving element. In addition, the driving element may include a switching transistor, a driving transistor, and the like. The driving element may be electrically connected to signal lines, such as a gate line and a data line, which are connected to a gate driver, a data driver, and the like disposed in the non-display area NA. A more detailed structure of the sub-pixel PX will be described later with reference to FIG. 4.

The plurality of sub-pixels PX may be defined as intersection areas of a plurality of gate lines disposed in a first direction and a plurality of data lines disposed in a second direction different from the first direction. Here, the first direction may be a horizontal direction of FIG. 3, and the second direction may be a vertical direction of FIG. 3, but they are not limited thereto. The plurality of sub-pixels PX may include a red sub-pixel, a green sub-pixel, a blue sub-pixel, and a white sub-pixel that emit light of different wavelengths, but are not limited thereto.

The non-display area NA corresponds to the edge area of the display panel, and may be an area where an image is not displayed. The non-display area NA may be disposed to surround the display area AA. Various components for driving the plurality of sub-pixels PX disposed in the display area AA may be disposed in the non-display area NA. For example, a driver IC that supplies signals for driving the plurality of sub-pixels PX, a driving circuit, a signal line, a flexible film or the like may be disposed in the non-display area NA. In this case, the driver IC may include a gate driver, a data driver, and the like. The gate driver and data driver can be implemented as transistors. The driver IC and driving circuit may be disposed in a GIP (Gate In Panel) manner, a COF (Chip On Film) manner, a TAB (Tape Automated Bonding) manner, a TCP (Tape Carrier Package) manner or a COG (Chip On Glass) manner, or may be integrated in the display panel.

The non-display area NA includes a pad area. For example, the pad area may be disposed at a lower end portion of the display panel. The pad area may include a plurality of pads 155 and signal lines connected to the plurality of pads 155. A driver IC, a driving circuit, or a flexible film may be connected to the pad area through the plurality of pads 155. The driver IC, the driving circuit, or the flexible film may transmit various driving signals, a low-potential voltage, and a high-potential voltage to the plurality of pads 155.

The plurality of pads 155 receive various driving signals for driving the flexible display device 100 and supply them to components of the flexible display device 100 such as the plurality of sub-pixels PX, whereby the flexible display device 100 can be driven.

The plurality of pads 155 include a data pad for supplying a data signal to each of the plurality of sub-pixels PX, a high-potential power supply pad for supplying a high-potential voltage to the first electrode of the light emitting element, and a low-potential power supply pad for supplying a low-potential voltage to the second electrode of the light emitting element.

For example, the low-potential power supply pad may be provided on both ends of the plurality of pads 155 on a one by one basis. The low-potential power supply line may be electrically connected to the low-potential power supply pad. In this case, the low-potential power supply line may be a first power supply line. The second electrode of the light emitting element may be electrically connected to the low-potential power supply line. Therefore, the low-potential power supply line may supply a low-potential voltage to the second electrode.

In addition, a connection line 126 may be electrically connected to the low-potential power supply pad. The connection line 126 may be electrically connected to a doped layer (or conductive layer) 145 of a lower buffer layer. That is, the connection line 126 is electrically connected to the doped layer 145 of the lower buffer layer through a plurality of contact holes 140 and meanwhile, may be connected (or grounded) to the low-potential power supply line, so that charges accumulated in the polyimide substrate may be removed.

The connection line 126 may be connected to the pads 155, that is, the low-potential power supply pad, in a quadrangular frame shape.

The connection line 126 may be formed of a metallic material having high conductivity. The connection line 126 may be composed of a light blocking pattern of the display area AA, the electrodes of the transistor, or the first electrode or the second electrode of the light emitting element.

In order to improve luminance defects in the edge area of the display panel due to charging of the polyimide substrate, the doped layer (or conductive layer) 145 having a quadrangular frame shape may be formed in the second buffer layer 111b under the polyimide substrate. However, the present disclosure is not limited thereto, and the doped layer 145 may be selectively formed only within the contact hole 140. That is, when forming the contact hole 140, the doped layer 145 may be selectively formed only within the contact hole 140 through doping, or may be formed in a portion of the second buffer layer 111b in a region where the contact hole 140 is to be formed.

The doped layer 145 may be formed by selectively doping the second buffer layer 111b.

The doped layer 145 may be formed to overlap a portion of the display area AA as well as the non-display area NA. However, the present disclosure is not limited thereto.

For ground, the contact hole 140 exposing the doped layer 145 of the second buffer layer 111b through the polyimide substrate is formed in the edge area of the display panel, and the connection line 126 may be electrically connected to the doped layer 145 of the second buffer layer 111b through the contact hole 140.

The contact hole 140 may be at least one contact hole. FIG. 3 illustrates a case in which a total of six contact holes 140 are provided at four corners of the display panel and between the corners, but the number of contact holes 140 in the present disclosure is not limited thereto.

Also, a high-potential power supply line 156 may be electrically connected to the high-potential power supply pad. In this case, the high-potential power supply line 156 may be a second power supply line. The high-potential power supply line 156 may extend in the second direction of the substrate to be parallel to the plurality of data lines connected to the data pad. The high-potential power supply line 156 may be electrically connected to the first electrode of the light emitting element through the transistor. Therefore, the high-potential power supply line 156 may supply a high-potential voltage to the first electrode. In FIG. 3, only two high-potential power supply lines 156 are illustrated for convenience of description, but the present disclosure is not limited thereto. The high-potential power supply line 156 and the data line may be provided in plural numbers such that they correspond to the plurality of sub-pixels PX, respectively.

With reference to FIG. 4, the flexible display device according to the first exemplary embodiment of the present disclosure may include a substrate 110, a transistor 120, the light emitting element 130, an encapsulation part 115h, and a support substrate 101.

The substrate 110 is a substrate for supporting and protecting various components of the flexible display device. The substrate 110 may be formed of a plastic material having flexibility. When the substrate 110 is formed of a plastic material, for example, the substrate 110 may be formed of polyimide, but is not limited thereto.

A first buffer layer 111a may be disposed on the substrate 110. The first buffer layer 111a may improve adhesion between layers formed on the first buffer layer 111a and the substrate 110 and block alkali components and the like that are leaked from the substrate 110.

The first buffer layer 111a may be formed of a single layer of silicon nitride (SiNx) or silicon oxide (SiOx) or multiple layers of silicon nitride (SiNx) and silicon oxide (SiOx). The first buffer layer 111a may be omitted. For example, the first buffer layer 111a may be omitted based on a type and material of the substrate 110, a structure and type of the transistor 120 or the like.

A light blocking pattern LS may be disposed on the first buffer layer 111a. The light blocking pattern LS may serve to block light incident from a lower portion thereof to an active layer 124 of the transistor 120. The light blocking pattern LS may be omitted.

A first insulating layer 115a may be disposed on the light blocking pattern LS.

The first insulating layer 115a may be formed of a single layer of silicon nitride (SiNx) or silicon oxide (SiOx) or multiple layers of silicon nitride (SiNx) and silicon oxide (SiOx).

The transistor 120 may be disposed on the first insulating layer 115a.

The transistor 120 may include the active layer 124, a gate electrode 121, a drain electrode 123, and a source electrode 122. The transistor 120 illustrated in FIG. 4 is a driving transistor, and is a thin film transistor having a top gate structure in which the gate electrode 121 is disposed above the active layer 124. However, the present disclosure is not limited thereto, and the transistor 120 may be implemented as a thin film transistor having a bottom gate structure.

The active layer 124 may be formed of an oxide semiconductor, amorphous silicon or polycrystalline silicon, but is not limited thereto. Polycrystalline silicon has superior mobility than amorphous silicon and low energy power consumption and excellent reliability, and thus, may be applied to a driving transistor within the pixel.

The oxide semiconductor has excellent mobility and uniformity properties. The oxide semiconductor may be formed of a quaternary metal oxide such as an indium tin gallium zinc oxide (InSnGaZnO)-based material, a ternary metal oxide such as an indium gallium zinc oxide (InGaZnO)-based material, an indium tin zinc oxide (InSnZnO)-based material, an tin gallium zinc oxide (SnGaZnO)-based material, an aluminum gallium zinc oxide (AlGaZnO)-based material, an indium aluminum zinc oxide (InAlZnO)-based material, and a tin aluminum zinc oxide (SnAlZnO)-based material, or a binary metal oxide such as an indium zinc oxide (InZnO)-based material, a tin zinc oxide (SnZnO)-based material, an aluminum zinc oxide (AlZnO)-based material, a zinc magnesium oxide (ZnMgO)-based material, a tin magnesium oxide (SnMgO)-based material, an indium magnesium oxide (InMgO)-based material, an indium gallium oxide (InGaO)-based material, an indium oxide (InO)-based material, a tin oxide (SnO)-based material, and a zinc oxide (ZnO)-based material. Composition ratios of respective elements included in the oxide semiconductor are not limited.

The active layer 124 may include a source region including a p-type or n-type impurity, a drain region, and a channel region between the source region and the drain region. The active layer 124 may further include a low concentration doped region between the source region and the drain region adjacent to the channel region.

In this case, the source region and the drain region are doped with a high concentration of impurity, and may be connected to the source electrode 122 and the drain electrode 123 of the transistor 120, respectively.

As an impurity ion, the p-type impurity or n-type impurity may be used. The p-type impurity may be one of boron (B), aluminum (Al), gallium (Ga), and indium (In), and the n-type impurity may be one of phosphorus (P), arsenic (As), and antimony (Sb).

The channel region of the active layer 124 may be doped with the n-type impurity or p-type impurity according to an NMOS or PMOS transistor structure, and the transistor included in the flexible display device according to the first exemplary embodiment of the present disclosure may be an NMOS or PMOS transistor.

A second insulating layer 115b is a gate insulating layer composed of a single layer of silicon oxide (SiOx) or silicon nitride (SiNx) or multiple layers thereof, and may be disposed on the active layer 124 such that a current flowing through the active layer 124 does not flow to the gate electrode 121. In addition, silicon oxide is less ductile than metal, but is superior in ductility to silicon nitride, so that it may be formed as a single layer or multiple layers depending on characteristics thereof.

The gate electrode 121 serves as a switch for turning on or turning off the transistor 120, and may be composed of a single layer or multiple layers of a conductive metal such as copper (Cu), aluminum (Al), molybdenum (Mo), chromium (Cr), gold (Au), titanium (Ti), nickel (Ni), and neodymium (Nd), or alloys thereof. However, embodiments of the present disclosure are not limited thereto.

The source electrode 122 or the drain electrode 123 is connected to the high-potential power supply line, and may enable the electric signal transmitted from the outside to be transmitted from the transistor 120 to the light emitting element 130. The source electrode 122 and the drain electrode 123 may be composed of a single layer or multiple layers of a conductive metal such as copper (Cu), aluminum (Al), molybdenum (Mo), chromium (Cr), gold (Au), titanium (Ti), nickel (Ni), and neodymium (Nd), or alloys thereof, but are not limited thereto.

To insulate the gate electrode 121 and the source electrode 122 and the drain electrode 123 from each other, a third insulating layer 115c composed of a single layer or multiple layers of silicon oxide (SiOx) or silicon nitride (SiNx) may be disposed between the gate electrode 121 and the source electrode 122 and the drain electrode 123.

At this time, contact holes for electrically connecting the drain electrode 123 and the source electrode 122 to the drain region and the source region of the active layer 124 respectively may be formed in the second insulating layer 115b and the third insulating layer 115c.

A passivation layer formed of an inorganic insulating layer such as silicon oxide (SiOx) or silicon nitride (SiNx) may be further disposed on the transistor 120.

The passivation layer may prevent unnecessary electrical connections between components disposed over and under the passivation layer and prevent contamination or damage from the outside. The passivation layer may be omitted depending on configurations and characteristics of the transistor 120 and the light emitting element 130.

Structures of the transistor 120 may be divided into an inverted-staggered structure and a coplanar structure according to positions of elements constituting the transistor 120. For example, the transistor having an inverted-staggered structure refers to a transistor having a structure in which a gate electrode is positioned opposite to a source electrode and a drain electrode based on the active layer. As in FIG. 4, the transistor 120 having a coplanar structure refers to a transistor having a structure in which the gate electrode 121 is positioned on the same side as the source electrode 122 and the drain electrode 123 based on the active layer 124.

For convenience of description, only a driving transistor is illustrated from among various transistors that may be included in the flexible display device 100. And, a switching transistor, a capacitor, or the like may also be included in the flexible display device.

In this case, when a signal is applied from a gate line to the switching transistor, the switching transistor transmits the signal from a data line to a gate electrode of the driving transistor. The driving transistor may transmit a current transferred through power supply lines to a first electrode 131 by the signal transmitted from the switching transistor, and control light emission by the current transmitted to the first electrode 131.

Planarization layers 115d and 115e may be disposed on the transistor 120 to protect the transistor 120, to alleviate a step caused by the transistor 120, and to reduce parasitic capacitance generated between the transistor 120 and the gate line and the data line, and the light emitting elements 130.

The planarization layers 115d and 115e may be formed of one or more materials selected from among acrylic resin, epoxy resin, polyamides resin, polyimides resin, unsaturated polyesters resin, phenolic resin, polyphenylene resin, polyphenylene sulfides resin and benzocyclobutene, but are not limited thereto.

The flexible display device according to the first exemplary embodiment of the present disclosure may include a first planarization layer 115d and a second planarization layer 115e that are sequentially stacked. That is, the first planarization layer 115d may be disposed on the transistor 120 and the second planarization layer 115e may be disposed on the first planarization layer 115d.

A buffer layer may be disposed on the first planarization layer 115d. The buffer layer may be composed of multiple layers of silicon oxide (SiOx) to protect components disposed on the first planarization layer 115d, and may be omitted depending on configurations and characteristics of the transistor 120 and the light emitting element 130.

An intermediate electrode 125 may be connected to the transistor 120 through a contact hole formed in the first planarization layer 115d. The intermediate electrode 125 is stacked so as to be connected to the transistor 120, and the data line may also be formed in a multilayer structure. However, the present disclosure is not limited thereto.

The data line may be formed to have a structure in which a lower layer formed of the same material as the source electrode 122 and the drain electrode 123 and an upper layer formed of the same material as the intermediate electrode 125 are connected to each other. That is, the data line may be implemented in a structure in which two layers are connected in parallel to each other, and in this case, line resistance of the data line may be reduced.

Meanwhile, a passivation layer formed of an inorganic insulating layer such as silicon oxide (SiOx) or silicon nitride (SiNx) may be further disposed on the first planarization layer 115d and the intermediate electrode 125. The passivation layer may serve to prevent unnecessary electrical connections between components and to prevent contamination or damage from the outside, and may be omitted depending on configurations and characteristics of the transistor 120 and the light emitting element 130.

The light emitting element 130 may be disposed on the second planarization layer 115e.

The light emitting element 130 may include the first electrode 131, a light emitting unit 132, and a second electrode 133.

The first electrode 131, which is an anode, may be disposed on the second planarization layer 115e.

The first electrode 131 serves to supply holes to the light emitting unit 132 and is connected to the intermediate electrode 125 through a contact hole in the second planarization layer 115e to thereby be electrically connected to the transistor 120.

The first electrode 131 may be formed of a transparent conductive material, such as indium tin oxide (ITO), indium zinc oxide (IZO), or the like, but is not limited thereto.

When the flexible display device is a top emission type display device that emits light to an upper portion thereof where the second electrode 133 is disposed, it may further include a reflective layer such that the emitted light is reflected from the first electrode 131 to be smoothly emitted in a direction toward the upper portion where the second electrode 133 is disposed.

That is, the first electrode 131 may be a two-layer structure in which a transparent conductive layer formed of a transparent conductive material and a reflective layer are sequentially stacked, or a three-layer structure in which a transparent conductive layer, a reflective layer and a transparent conductive layer are sequentially stacked. The reflective layer may be formed of silver (Ag) or an alloy including silver.

A bank 115f disposed on the first electrode 131 and the second planarization layer 115e may define the sub-pixels by dividing areas that actually emit light. After forming a photoresist on the first electrode 131, the bank 115f may be formed by photolithography. Photoresist refers to a photosensitive resin whose solubility in a developer is changed by the action of light, and a specific pattern may be obtained by exposing and developing the photoresist. Types of photoresist may be classified into a positive photoresist and a negative photoresist. The positive photoresist is a photoresist where solubility of an exposed portion thereof in the developer is increased by exposure. When the positive photoresist is developed, a pattern from which exposed portions are removed is obtained. The negative photoresist is a photoresist where solubility of the exposed portion thereof in the developer is significantly lowered by the exposure. When the negative photoresist is developed, a pattern from which non-exposed portions are removed is obtained.

A fine metal mask (FMM) which is a deposition mask, may be used to form the light emitting unit 132 of the light emitting element 130.

In addition, to prevent damage that may occur due to contact with the deposition mask disposed on the bank 115f and to maintain a constant distance between the bank 115f and the deposition mask, a spacer 115g formed of one of polyimide which is a transparent organic material, photo acryl, and benzocyclobutene (BCB) may be disposed on the bank 115f.

The light emitting unit 132 may be disposed between the first electrode 131 and the second electrode 133.

The light emitting unit 132 serves to emit light and may include at least one of a hole injection layer (HIL), a hole transport layer (HTL), a light emitting layer, an electron transport layer (ETL), and an electron injection layer (EIL), and some components may be omitted depending on a structure or characteristics of the flexible display device. Here, an electroluminescent layer and an inorganic emitting layer may be used as the light emitting layer.

The hole injection layer is disposed on the first electrode 131 to facilitate an injection of holes.

The hole transport layer is disposed on the hole injection layer to smoothly transport holes to the light emitting layer.

The light emitting layer is disposed on the hole transport layer and may include a material capable of emitting light of a specific color to thereby emit light of a specific color. In addition, a luminescent material may be formed using a phosphorescent material or a fluorescent material.

The electron injection layer may be further disposed on the electron transport layer. The electron injection layer is an organic layer that facilitates an injection of electrons from the second electrode 133 and may be omitted depending on the structure and characteristics of the flexible display device.

Meanwhile, at a position adjacent to the light emitting layer, an electron blocking layer or a hole blocking layer that blocks a flow of holes or electrons is further disposed to thereby prevent a phenomenon in which when electrons are injected into the light emitting layer, the electrons move from the light emitting layer and pass to the adjacent hole transport layer or a phenomenon in which when holes are injected into the light emitting layer, the holes move from the light emitting layer and pass to the adjacent electron transport layer, so that luminous efficiency may be improved.

The second electrode 133, which is a cathode, is disposed on the light emitting unit 132 and serves to supply electrons to the light emitting unit 132. Since the second electrode 133 needs to supply electrons, it may be formed of a metallic material such as magnesium (Mg), silver-magnesium (Ag: Mg), which is a conductive material having a low work function, but is not limited thereto.

When the flexible display device is a top emission type display device, the second electrode 133 may be a transparent conductive oxide such as indium tin oxide (ITO), indium zinc oxide (IZO), indium tin zinc oxide (ITZO), zinc oxide (ZnO), and tin oxide (TO).

The encapsulation part 115h may be disposed on the light emitting element 130 to prevent the transistor 120 and the light emitting element 130, which are components of the flexible display device, from being oxidized or damaged due to moisture, oxygen, or impurities introduced from the outside.

The encapsulation part 115h may be formed by stacking a plurality of encapsulation layers, a foreign material compensation layer, and a plurality of barrier films.

The encapsulation layer may be disposed on the entire surface of an upper portion of the transistor 120 and the light emitting element 130, and may be formed of one of silicon nitride (SiNx) or aluminum oxide (AlyOz) which is an inorganic material. However, embodiments are not limited thereto. An encapsulation layer may be further disposed on the foreign material compensation layer disposed on the encapsulation layer.

The foreign material compensation layer is disposed on the encapsulation layer, and an organic material such as silicon oxycarbon (SiOCz), acrylic (acryl), or epoxy-based resin may be used for the foreign material compensation layer. However, embodiments are not limited thereto. When a defect occurs due to a crack generated by a foreign material or particles that may be generated during a process, it may be compensated for by covering a crack and a foreign material by the foreign material compensation layer.

A barrier film may be disposed on the encapsulation layer and the foreign material compensation layer, whereby the flexible display device may delay the penetration of oxygen and moisture from the outside. The barrier film is configured in the form of a light-transmissive and double-sided adhesive film, and may be composed of any one of olefin-based, acrylic-based, and silicon-based insulating materials. Alternatively, a barrier film composed of any one of COP (cycloolefin polymer), COC (cycloolefin copolymer) and PC (Polycarbonate) may be further stacked, but is not limited thereto.

Meanwhile, a support member may be further disposed under the display panel configured as described above, that is, under the substrate 110.

When the substrate 110 of the display panel is formed of a plastic material such as polyimide, a manufacturing process of the flexible display device is conducted in a situation in which the support substrate 101 formed of glass is disposed under the display panel. After the manufacturing process is completed, a certain thickness of the support substrate 101 may be etched such that it can be rollable or bendable and thus, the support substrate 101 may be used as a support member. However, the present disclosure is not limited thereto, and the support substrate may be separated and released. Since a configuration for supporting the display panel is required even after the support substrate is released, a protective film and an auxiliary substrate formed of a plastic material such as polyimide may be additionally attached to the display panel, as a support member.

A second buffer layer 111b may be disposed between the substrate 100 and the support substrate 101.

The second buffer layer 111b may be formed of a single layer of silicon nitride (SiNx) or silicon oxide (SiOx) or multiple layers of silicon nitride (SiNx) and silicon oxide (SiOx), but is not limited thereto.

The support substrate 101 and the second buffer layer 111b may prevent foreign materials from being attached to a lower portion of the substrate 110, and may serve to buffer impacts from the outside.

FIG. 5 is a cross-sectional view showing a detailed structure of the non-display area illustrated in FIG. 3.

Some components in FIG. 5 are substantially the same as and similar to those described in FIG. 4, and thus, descriptions thereof are omitted.

With reference to FIG. 5, the substrate 110 may be disposed to support and protect various components of the flexible display device.

The substrate 110 may be formed of a plastic material having flexibility. When the substrate 110 is formed of a plastic material, for example, it may be formed of polyimide, but is not limited thereto.

The second buffer layer 111b may be disposed under the substrate 110.

The support substrate 101 formed of glass may be disposed under the second buffer layer 111b.

In order to improve luminance defects in the edge area of the display panel due to charging of the polyimide substrate, the doped layer (or conductive layer) 145 may be formed in the second buffer layer 111b under the substrate 110.

The doped layer 145 may be formed by selectively doping the second buffer layer 111b.

As impurity ions used for doping, a p-type impurity or an n-type impurity may be used. The p-type impurity may be one of boron (B), aluminum (Al), gallium (Ga), and indium (In), and the n-type impurity may be one of phosphorus (P), arsenic (As), and antimony (Sb). However, the present disclosure is not limited thereto.

Instead of doping using impurity ions, a metal layer may be additionally formed on or inside the second buffer layer 111b. An inner metal layer may be composed of a conductive metal such as copper (Cu), aluminum (Al), chromium (Cr), gold (Au), molybdenum (Mo), titanium (Ti), and nickel (Ni), or may be composed of a transparent conductive material such as indium tin oxide (ITO), indium zinc oxide (IZO), or the like.

The doped layer 145 may be formed to overlap a portion of the display area as well as the non-display area, in a quadrangular frame shape. However, the present disclosure is not limited thereto. As described above, the doped layer 145 may be selectively formed only within the contact hole 140.

Meanwhile, the first buffer layer 111a may be disposed on the substrate 110.

The contact hole 140 exposing a portion of the doped layer 145 may be formed in the first buffer layer 111a and the substrate 110 in the non-display area. The contact hole 140 may penetrate the first buffer layer 111a and the substrate 110 to expose a portion of the doped layer 145.

The connection line 126 may be disposed on the first buffer layer 111a in the non-display area.

The connection line 126 may be connected to the low-potential power supply pad, for example, in a quadrangular frame shape. However, the present disclosure is not limited thereto.

The connection line 126 may be composed of a light blocking pattern of the display area, the electrodes of the transistor, or the first electrode or the second electrode of the light emitting element.

FIG. 5 illustrates an example in which the connection line 126 is formed of a conductive material constituting the light blocking pattern when forming the light blocking pattern in the display area, but the present disclosure is not limited thereto.

The connection line 126 may be electrically connected to the doped layer 145 of the second buffer layer 111b through the contact hole 140.

The first insulating layer 115a may be disposed on the connection line 126.

Components provided on the first insulating layer 115a are substantially the same as and similar to components described in FIG. 4, and thus, descriptions thereof will be omitted.

Meanwhile, the connection line of the present disclosure may be composed of the electrodes of the transistor, or the first electrode or the second electrode of the light emitting element, in addition to the light blocking pattern. For example, a second exemplary embodiment in which the connection line is composed of the source electrode and the drain electrode of the transistor will be described in detail with reference to FIG. 6.

Figure 6:
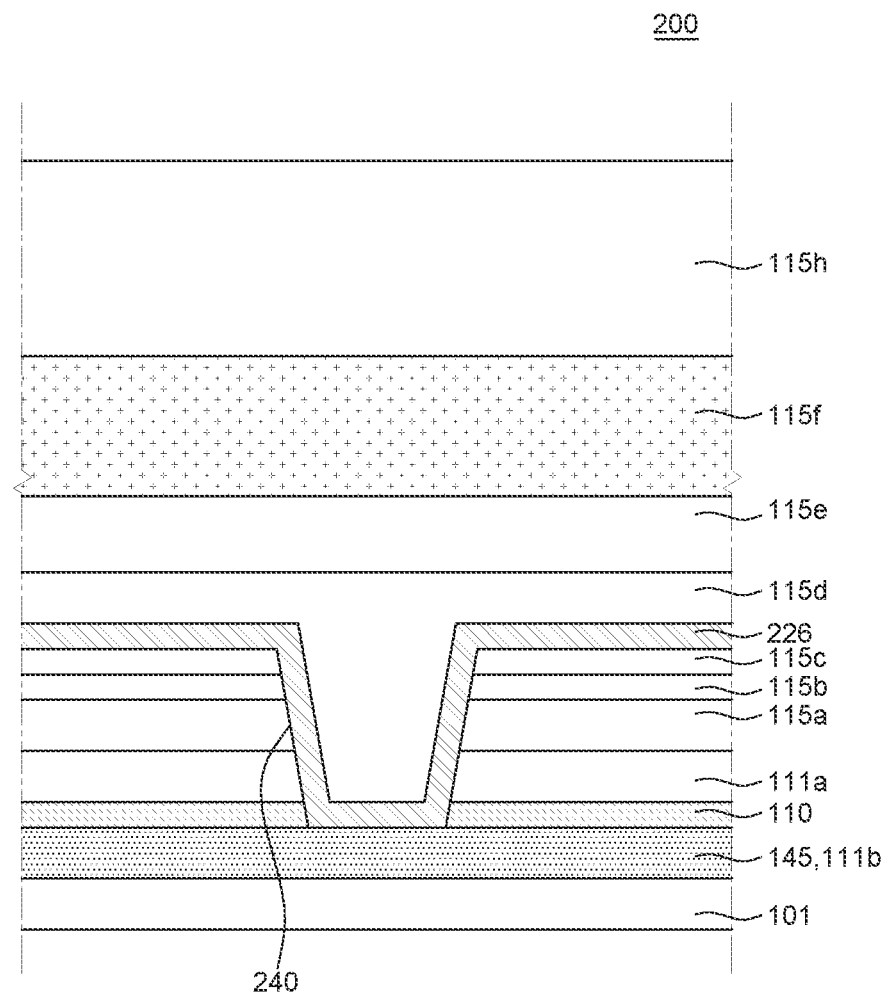
FIG. 6 is a cross-sectional view illustrating a portion of a non-display area in a flexible display device according to a second exemplary embodiment of the present disclosure.

FIG. 6 is a cross-sectional view illustrating a portion of a non-display area in a flexible display device according to a second exemplary embodiment of the present disclosure.

The second exemplary embodiment of the present disclosure of FIG. 6 may be configured to have substantially the same components as the first exemplary embodiment of the present disclosure, except for components of a connection line 226 and a contact hole 240. Therefore, a description of the same components will be omitted.

FIG. 6 is a cross-sectional view showing a detailed structure of the non-display area.

With reference to FIG. 6, the substrate 110 may be disposed to support and protect various components of the flexible display device.

The substrate 110 may be formed of a plastic material having flexibility. When the substrate 110 is formed of a plastic material, for example, it may be formed of polyimide, but is not limited thereto.

The second buffer layer 111b may be disposed under the substrate 110.

The support substrate 101 formed of glass may be disposed under the second buffer layer 111b.

In order to improve luminance defects in the edge area of the display panel due to charging of the polyimide substrate, the doped layer (or conductive layer) 145 may be formed in the second buffer layer 111b under the substrate 110.

The doped layer 145 may be formed by selectively doping the second buffer layer 111b.

As impurity ions used for doping, a p-type impurity or an n-type impurity may be used. The p-type impurity may be one of boron (B), aluminum (Al), gallium (Ga), and indium (In), and the n-type impurity may be one of phosphorus (P), arsenic (As), and antimony (Sb). However, the present disclosure is not limited thereto.

Instead of doping using impurity ions, a metal layer may be additionally formed on or inside the second buffer layer 111b. An inner metal layer may be composed of a conductive metal such as copper (Cu), aluminum (Al), chromium (Cr), gold (Au), molybdenum (Mo), titanium (Ti), and nickel (Ni), or may be composed of a transparent conductive material such as indium tin oxide (ITO), indium zinc oxide (IZO), or the like.

The doped layer 145 may be formed to overlap a portion of the display area as well as the non-display area, in a quadrangular frame shape. However, the present disclosure is not limited thereto. As described above, the doped layer 145 may be selectively formed only within the contact hole 240, or may be formed in a portion of the second buffer layer 111b in a region where the contact hole 240 is to be formed.

Meanwhile, the first buffer layer 111a may be disposed on the substrate 110.

The first insulating layer 115a may be disposed on the first buffer layer 111a.

The second insulating layer 115b may be disposed on the first insulating layer 115a.

The third insulating layer 115c may be disposed on the second insulating layer 115b.

In the second exemplary embodiment of the present disclosure, the contact hole 240 exposing a portion of the doped layer 145 may be formed in the first buffer layer 111a, the first insulating layer 115a, the second insulating layer 115b, the third insulating layer 115c, and the substrate 110 in the non-display area. In this case, the contact hole 240 may penetrate the first buffer layer 111a, the first insulating layer 115a, the second insulating layer 115b, the third insulating layer 115c, and the substrate 110 to expose a portion of the doped layer 145.

In addition, the connection line 226 may be disposed on the third insulating layer 115c in the non-display area.

The connection line 226 may be connected to the low-potential power supply pad, for example, in a quadrangular frame shape. However, the present disclosure is not limited thereto.

The connection line 226 may be formed of a conductive material constituting the source electrode and the drain electrode of the transistor in the display area, but is not limited thereto.

The connection line 226 may be electrically connected to the doped layer 145 of the second buffer layer 111b through the contact hole 240.

The first planarization layer 115d may be disposed on the connection line 226.

Components provided on the first planarization layer 115d are substantially the same as and similar to components of the first exemplary embodiment of the present disclosure described above, and thus, a description thereof will be omitted.

Meanwhile, the support member provided under the polyimide substrate of the present disclosure may be composed of another polyimide substrate, in addition to etched glass, and this will be described in detail with reference to FIGS. 7 and 8.

Figure 7:
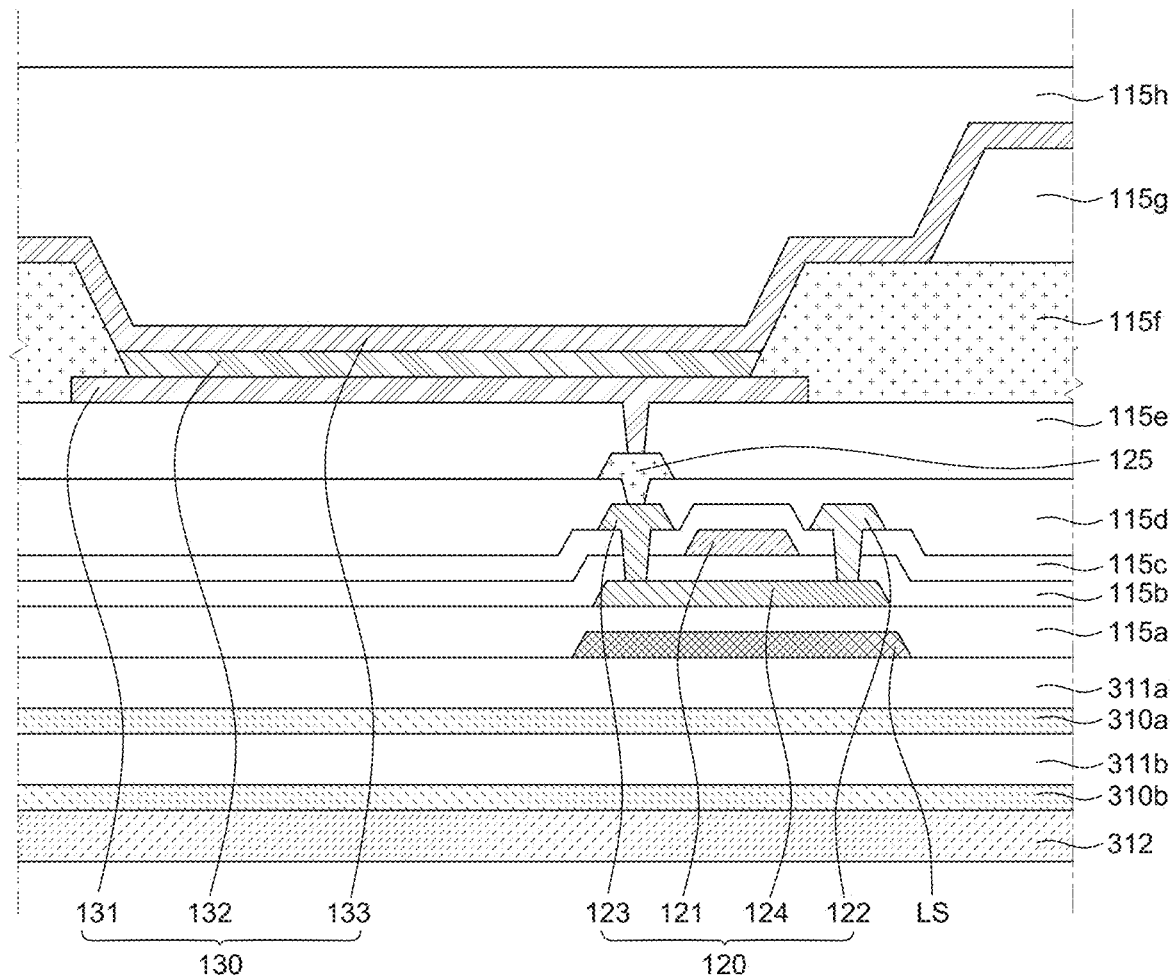
FIG. 7 is a cross-sectional view illustrating a portion of a display area in a flexible display device according to a third exemplary embodiment of the present disclosure.

FIG. 7 is a cross-sectional view illustrating a portion of a display area in a flexible display device according to a third exemplary embodiment of the present disclosure.

Figure 8:
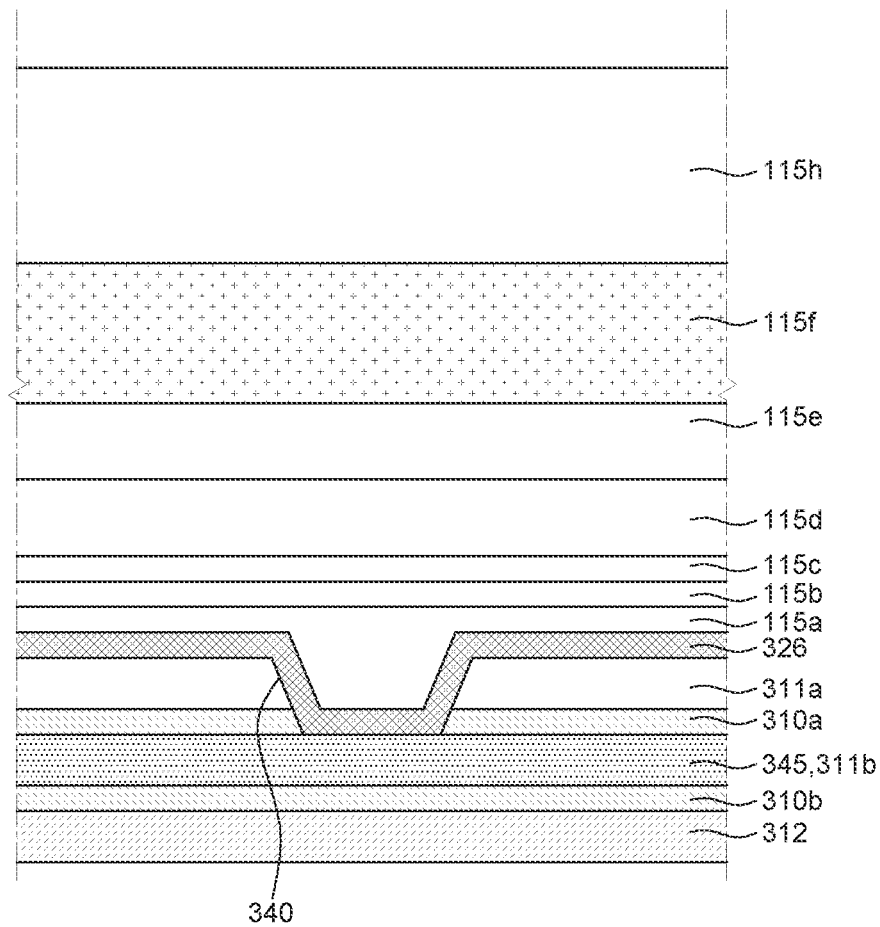
FIG. 8 is a cross-sectional view illustrating a portion of a non-display area in the flexible display device according to the third exemplary embodiment of the present disclosure.

FIG. 8 is a cross-sectional view illustrating a portion of a non-display area in the flexible display device according to the third exemplary embodiment of the present disclosure.

With reference to FIG. 7, the flexible display device according to the third exemplary embodiment of the present disclosure may include a substrate 310a, the transistor 120, the light emitting element 130, the encapsulation part 115h, and an auxiliary substrate 310b.

The substrate 310a may be formed of a plastic material having flexibility. When the substrate 310a is formed of a plastic material, for example, it may be formed of polyimide, but is not limited thereto.

A first buffer layer 311a may be disposed on the substrate 310a. The first buffer layer 311a may improve adhesion between layers formed on the first buffer layer 311a and the substrate 310a, and may block alkali components and the like that are leaked from the substrate 310a.

The first buffer layer 311a may be formed of a single layer of silicon nitride (SiNx) or silicon oxide (SiOx) or multiple layers of silicon nitride (SiNx) and silicon oxide (SiOx). The first buffer layer 311a may be omitted. For example, the first buffer layer 311a may be omitted based on a type and material of the substrate 310a, the structure and type of the transistor 120, and the like.

The light blocking pattern LS may be disposed on the first buffer layer 311a.

The first insulating layer 115a may be disposed on the light blocking pattern LS.

The transistor 120 may be disposed on the first insulating layer 115a.

The transistor 120 may include the active layer 124, the gate electrode 121, the drain electrode 123, and the source electrode 122.

Since the transistor 120 is substantially the same as that of the first exemplary embodiment of the present disclosure described above, a description thereof will be omitted.

The second insulating layer 115b may be disposed on the active layer 124.

In addition, the third insulating layer 115c may be disposed between the gate electrode 121, and the source electrode 122 and the drain electrode 123.

The first planarization layer 115d may be disposed on the transistor 120, and the second planarization layer 115e may be disposed on the first planarization layer 115d.

The intermediate electrode 125 may be electrically connected to the transistor 120 through a contact hole formed in the first planarization layer 115d.

The light emitting element 130 may be disposed on the second planarization layer 115e.

The light emitting element 130 may include the first electrode 131, the light emitting unit 132, and the second electrode 133, and is substantially the same as that of the first exemplary embodiment of the present disclosure described above. Thus, a description of the light emitting element 130 will be omitted.

The bank 115f may be disposed on the first electrode 131 and the second planarization layer 115e.

Also, the spacer 115g may be disposed on the bank 115f.

The encapsulation part 115h may be disposed on the light emitting element 130.

The encapsulation part 115h may be formed by stacking a plurality of encapsulation layers, a foreign material compensation layer, and a plurality of barrier films.

Meanwhile, a support member may be further disposed under the display panel configured as described above, that is, under the substrate 310a.

The support member according to the third exemplary embodiment of the present disclosure may include a protective film 312 and the auxiliary substrate 310b formed of a plastic material such as polyimide.

A second buffer layer 311b may be disposed between the substrate 310a and the auxiliary substrate 310b.

Some components in FIG. 8 are substantially the same as and similar to those described in FIG. 7, and thus, descriptions thereof will be omitted.

With reference to FIG. 8, the second buffer layer 311b may be disposed under the substrate 310a in the non-display area.

The auxiliary substrate 310b formed of a plastic material such as polyimide and the protective film 312 may be sequentially disposed under the second buffer layer 311b.

In order to improve luminance defects in the edge area of the display panel due to charging of the polyimide substrate 310a, a doped layer (or conductive layer) 345 may be formed in the second buffer layer 311b under the substrate 310a.

The doped layer 345 may be formed by selectively doping the second buffer layer 311b.

As impurity ions used for doping, a p-type impurity or an n-type impurity may be used. The p-type impurity may be one of boron (B), aluminum (Al), gallium (Ga), and indium (In), and the n-type impurity may be one of phosphorus (P), arsenic (As), and antimony (Sb). However, the present disclosure is not limited thereto.

Instead of doping using impurity ions, a metal layer may be additionally formed on or inside the second buffer layer 311b. An inner metal layer may be composed of a conductive metal such as copper (Cu), aluminum (Al), chromium (Cr), gold (Au), molybdenum (Mo), titanium (Ti), and nickel (Ni), or may be composed of a transparent conductive material such as indium tin oxide (ITO), indium zinc oxide (IZO), or the like.

The doped layer 345 may be formed to overlap a portion of the display area as well as the non-display area, in a quadrangular frame shape. However, the present disclosure is not limited thereto. As described above, the doped layer 345 may be selectively formed only within a contact hole 340 or may be formed in a portion of the second buffer layer 311b in a region where the contact hole 340 is to be formed.

Meanwhile, the first buffer layer 311a may be disposed on the substrate 310a.

The contact hole 340 exposing a portion of the doped layer 345 may be formed in the first buffer layer 311a and the substrate 310a in the non-display area. The contact hole 340 may penetrate the first buffer layer 311a and the substrate 310a to expose a portion of the doped layer 345.

A connection line 326 may be disposed on the first buffer layer 311a in the non-display area.

The connection line 326 may be connected to the low-potential power supply pad, for example, in a quadrangular frame shape. However, the present disclosure is not limited thereto.

The connection line 326 may be composed of a light blocking pattern of the display area, the electrodes of the transistor, or the first electrode or the second electrode of the light emitting element.

FIG. 8 illustrates an example in which the connection line 326 is formed of a conductive material constituting the light blocking pattern when forming the light blocking pattern in the display area, but the present disclosure is not limited thereto.

The connection line 326 may be electrically connected to the doped layer 345 of the second buffer layer 311b through the contact hole 340.

The first insulating layer 115a may be disposed on the connection line 326.

Components provided on the first insulating layer 115a are substantially the same as and similar to components described in FIG. 7, and thus, descriptions thereof will be omitted.

Meanwhile, in the present disclosure, a metal layer, instead of the doped layer, is formed within the second buffer layer and thus, is electrically connected to the connection line through a contact hole, which will be described in detail with reference to FIG. 9.

Figure 9:
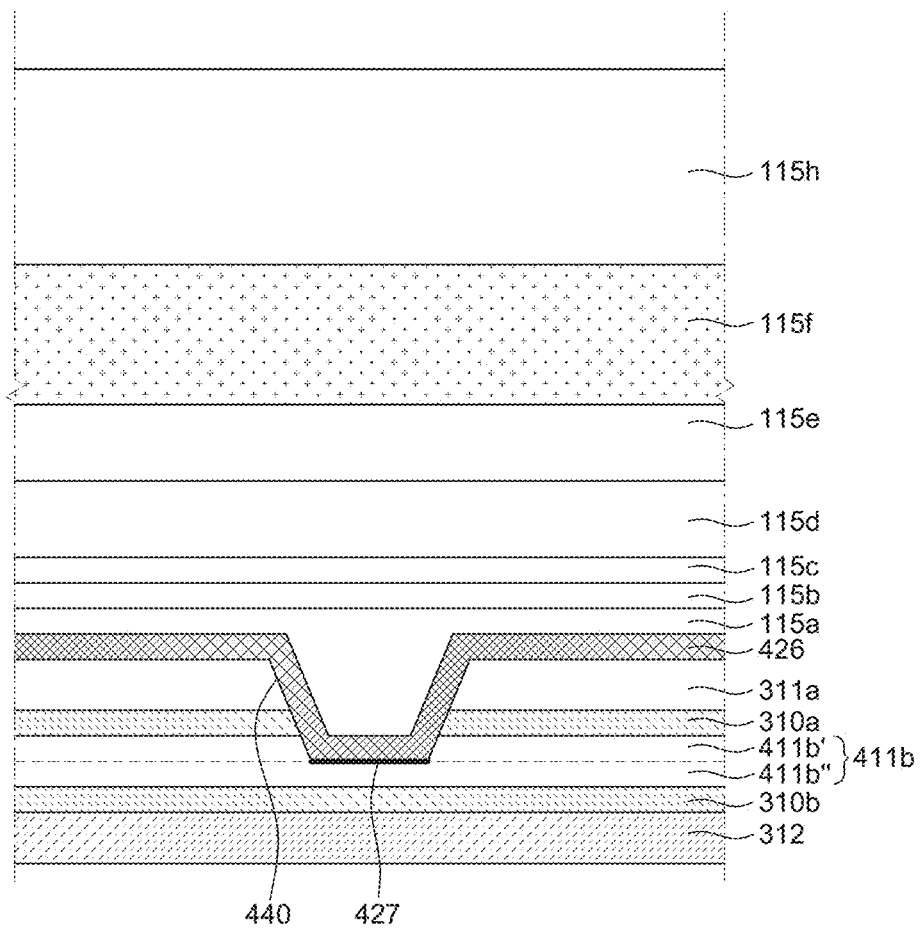
FIG. 9 is a cross-sectional view illustrating a portion of a non-display area in a flexible display device according to a fourth exemplary embodiment of the present disclosure.

FIG. 9 is a cross-sectional view illustrating a portion of a non-display area in a flexible display device according to a fourth exemplary embodiment of the present disclosure.

Some components of FIG. 9 are substantially the same as and similar to those described in FIG. 8, and thus, descriptions thereof are omitted.

With reference to FIG. 9, a second buffer layer 411b may be disposed under the substrate 310a in the non-display area.

The auxiliary substrate 310b formed of a plastic material such as polyimide and the protective film 312 may be sequentially disposed under the second buffer layer 411b.

In order to improve luminance defects in the edge area of the display panel due to charging of the polyimide substrate 310a, a metal layer 427 may be formed in the second buffer layer 411b.

That is, the second buffer layer 411b of the fourth exemplary embodiment of the present disclosure may include a second upper buffer layer 411b' under the substrate 310a and a second lower buffer layer 411b'' under the second upper buffer layer 411b'. However, the present disclosure is not limited thereto, and the second buffer layer 411b may be formed of a single layer or multiple layers of two or more layers.

In addition, the metal layer 427 may be formed at an interface between the second upper buffer layer 411b' and the second lower buffer layer 411b''. However, the present disclosure is not limited thereto. When the second buffer layer 411b is formed of a single layer, the metal layer 427 may be formed in any inner portion of the second buffer layer 411b. The metal layer 427 may also be formed on the second buffer layer 411b.

The metal layer 427 may be composed of a conductive metal such as copper (Cu), aluminum (Al), chromium (Cr), gold (Au), molybdenum (Mo), titanium (Ti), and nickel (Ni), or a transparent conductive material such as indium tin oxide (ITO), indium zinc oxide (IZO), or the like.

The metal layer 427 may be selectively formed only within a contact hole 440, or may be formed in a portion of the second lower buffer layer 411b'' in a region where the contact hole 440 is to be formed. The metal layer 427 may be formed to overlap a portion of the display area as well as the non-display area, in a quadrangular frame shape.

Meanwhile, the first buffer layer 311a may be disposed on the substrate 310a.

The contact hole 440 exposing a portion of the metal layer 427 may be formed in the first buffer layer 311a, the substrate 310a, and the second upper buffer layer 411b' in the non-display area. The contact hole 440 may penetrate the first buffer layer 311a, the substrate 310a, and the second upper buffer layer 411b' to expose a portion of the metal layer 427.

A connection line 426 may be disposed on the first buffer layer 311a in the non-display area.

The connection line 426 may be connected to the low-potential power supply pad, for example, in a quadrangular frame shape. However, the present disclosure is not limited thereto.

The connection line 426 may be composed of a light blocking pattern of the display area, the electrodes of the transistor, or the first electrode or the second electrode of the light emitting element.

In this case, the connection line 426 may be electrically connected to the metal layer 427 inside the second buffer layer 411b through the contact hole 440.

Meanwhile, the connection line of the present disclosure may be configured of the second electrode of the light emitting element, which will be described in detail with reference to FIGS. 10 and 11.

Figure 10:
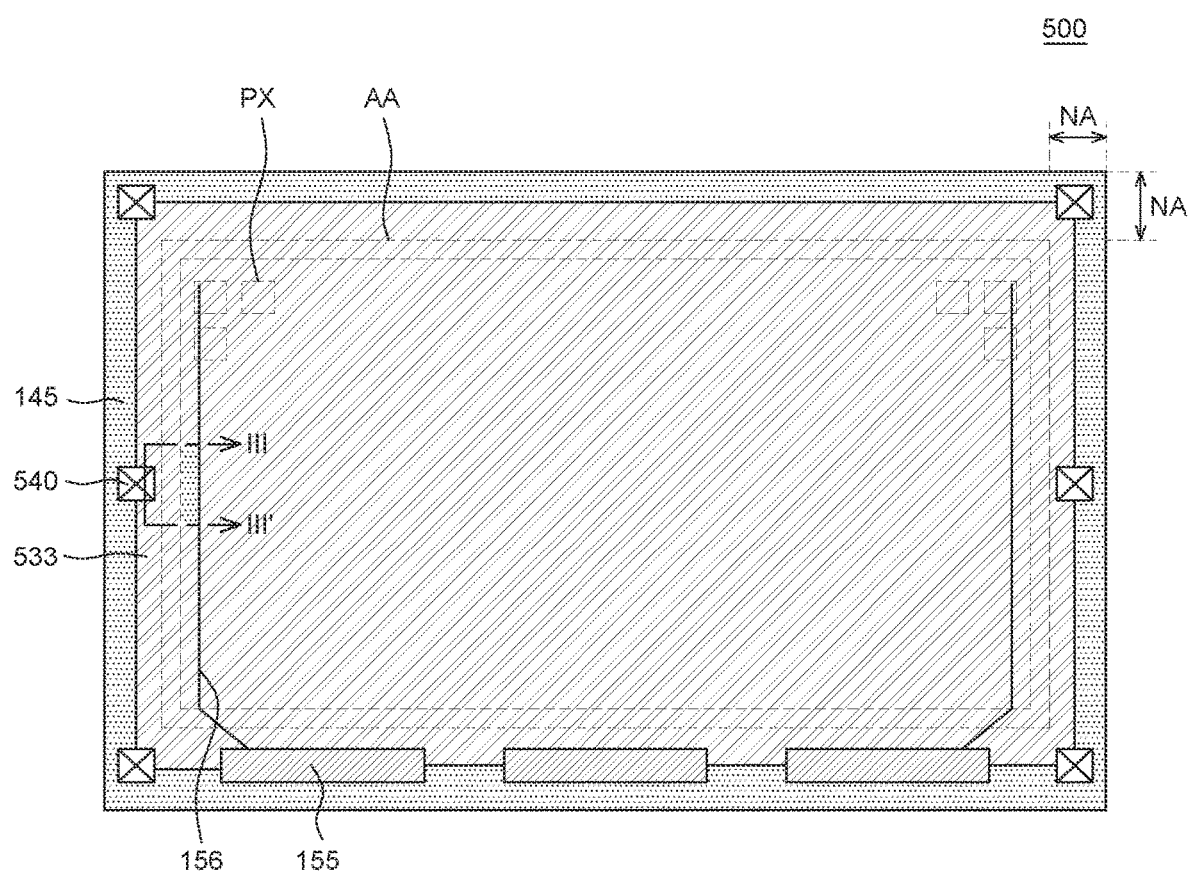
FIG. 10 is a plan view of a flexible display device according to a fifth exemplary embodiment of the present disclosure.

FIG. 10 is a plan view of a flexible display device according to a fifth exemplary embodiment of the present disclosure.

Figure 11:
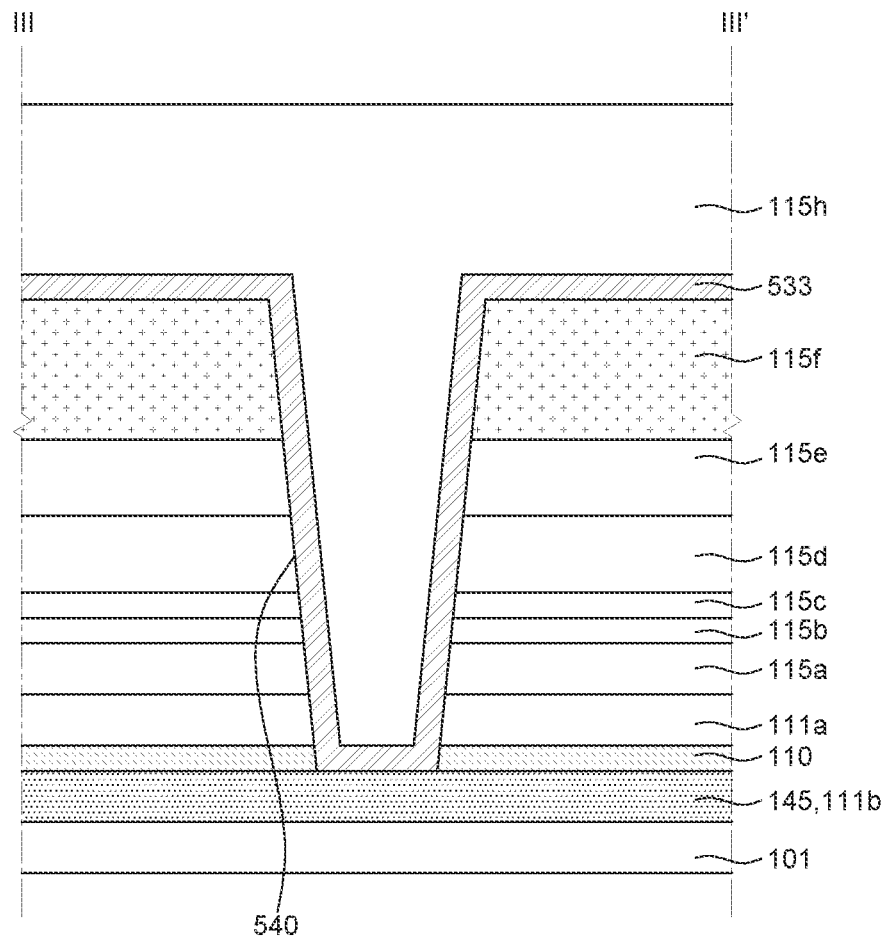
FIG. 11 is a cross-sectional view taken along line III-III' of FIG. 10.

FIG. 11 is a cross-sectional view taken along line III-III' of FIG. 10.

FIG. 11 shows a detailed structure of a non-display area NA described with reference to FIG. 10.

With reference to FIG. 10, a flexible display device 500 according to the fifth exemplary embodiment of the present disclosure includes a display area AA and a non-display area NA.

For convenience, the non-display area NA may be defined as an area excluding the display area AA.

The display area AA may be disposed in the center of the display panel, and may be an area where an image is displayed in the flexible display device 500.

The display area AA may include a plurality of sub-pixels PX.

The non-display area NA corresponds to the edge area of the display panel, and may be an area where an image is not displayed. The non-display area NA may be disposed to surround the display area AA.

The non-display area NA includes a pad area. For example, the pad area may be disposed at a lower end portion of the display panel. The pad area may include the plurality of pads 155 and signal lines connected to the plurality of pads 155. A driver IC, a driving circuit, or a flexible film may be connected to the pad area through the plurality of pads 155. The driver IC, the driving circuit, or the flexible film may transmit various driving signals, a low-potential voltage, and a high-potential voltage to the plurality of pads 155.

The plurality of pads 155 receive various driving signals for driving the flexible display device 500 and supply them to components of the flexible display device 500 such as the plurality of sub-pixels PX, whereby the flexible display device 500 can be driven.

The plurality of pads 155 include a data pad for supplying a data signal to each of the plurality of sub-pixels PX, a high-potential power supply pad for supplying a high-potential voltage to the first electrode of the light emitting element, and a low-potential power supply pad for supplying a low-potential voltage to the second electrode of the light emitting element.

For example, the low-potential power supply pad may be provided on both ends of the plurality of pads 155. The low-potential power supply line may be electrically connected to the low-potential power supply pad. In this case, the low-potential power supply line may be a first power supply line. The second electrode of the light emitting element may be electrically connected to the low-potential power supply line. Therefore, the low-potential power supply line may supply a low-potential voltage to the second electrode.

In addition, a second electrode 533 may be electrically connected to the low-potential power supply pad.

The second electrode 533 may extend to the non-display area NA and may be electrically connected to the doped layer (or conductive layer) 145 of the lower buffer layer. That is, the second electrode 533 extending through a plurality of contact holes 540 is electrically connected to the doped layer (or conductive layer) 145 of the lower buffer layer, and at the same time, may also be connected (or grounded) to the low-potential power supply line.

The second electrode 533 may be connected to the pads 155, that is, the low-potential power supply pad, for example, in a rectangular shape.

The second electrode 533 may be formed of a metallic material having high conductivity. The second electrode 533 may be formed by extending the cathode of the light emitting element in the display area AA.

In this case, the second electrode 533 may be formed to overlap a portion of the non-display area NA as well as the display area AA.

The doped layer (or conductive layer) 145 having a quadrangular frame shape may be formed in the second buffer layer 111b under the polyimide substrate. As described above, the doped layer 145 may be selectively formed only within the contact hole 540, or may be formed in a portion of the second buffer layer 111b in a region where the contact hole 540 is to be formed.

The doped layer 145 may be formed by selectively doping the second buffer layer 111b.

The doped layer 145 may be formed to overlap a portion of the display area AA as well as the non-display area NA. However, the present disclosure is not limited thereto.

The second electrode 533 may extend in a direction toward the non-display area NA so as to overlap a portion of the doped layer 145.

For ground, the contact hole 540 exposing the doped layer 145 of the second buffer layer 111b through the polyimide substrate is formed in the edge area of the display panel, and the second electrode 533 may be electrically connected to the doped layer 145 of the second buffer layer 111b through the contact hole 540.

The connection lines 126, 226, 326, and 426 described above in the present disclosure, and the second electrode 533 according to the fifth exemplary embodiment of the present disclosure may be referred to as connection members.

The contact hole 540 may be at least one contact hole. FIG. 10 shows an example in which a total of six contact holes 540 are provided at four corners of the display panel and between the corners, but the number of contact holes 540 in the present disclosure is not limited thereto.

Also, the high-potential power supply line 156 may be electrically connected to the high-potential power supply pad. In this case, the high-potential power supply line 156 may be a second power supply line. The high-potential power supply line 156 may extend in the second direction of the substrate to be parallel to the plurality of data lines connected to the data pad. The high-potential power supply line 156 may be electrically connected to the first electrode of the light emitting element. That is, the high-potential power supply line 156 may be electrically connected to the first electrode of the light emitting element through the transistor. Therefore, the high-potential power supply line 156 may supply a high-potential voltage to the first electrode. In FIG. 10, only two high-potential power supply lines 156 are illustrated for convenience of description, but the present disclosure is not limited thereto. The high-potential power supply line 156 and the data line may be provided in plural numbers such that they correspond to the plurality of sub-pixels PX, respectively.

With reference to FIG. 11, the second buffer layer 111b may be disposed under the substrate 110 in the non-display area.

The substrate 110 may be formed of a plastic material having flexibility. When the substrate 110 is formed of a plastic material, for example, it may be formed of polyimide, but is not limited thereto.

The support substrate 101 formed of glass may be disposed under the second buffer layer 111b.

In order to improve luminance defects in the edge area of the display panel due to charging of the polyimide substrate 110, the doped layer (or conductive layer) 145 may be formed in the second buffer layer 111b under the substrate 110.

The doped layer 145 may be formed by selectively doping the second buffer layer 111b.

As impurity ions used for doping, a p-type impurity or an n-type impurity may be used. The p-type impurity may be one of boron (B), aluminum (Al), gallium (Ga), and indium (In), and the n-type impurity may be one of phosphorus (P), arsenic (As), and antimony (Sb). However, the present disclosure is not limited thereto.

Instead of doping using impurity ions, a metal layer may be additionally formed on or inside the second buffer layer 111b. An inner metal layer may be composed of a conductive metal such as copper (Cu), aluminum (Al), chromium (Cr), gold (Au), molybdenum (Mo), titanium (Ti), and nickel (Ni), or may be composed of a transparent conductive material such as indium tin oxide (ITO), indium zinc oxide (IZO), or the like.

The doped layer 145 may be formed to overlap a portion of the display area as well as the non-display area, in a quadrangular frame shape. However, the present disclosure is not limited thereto.

Meanwhile, the first buffer layer 111a may be disposed on the substrate 110.

The first insulating layer 115a may be disposed on the first buffer layer 111a.

The second insulating layer 115b may be disposed on the first insulating layer 115a.

The third insulating layer 115c may be disposed on the second insulating layer 115b.

The first and second planarization layers 115d and 115e may be disposed on the third insulating layer 115c.

The bank 115f may be disposed on the second planarization layer 115e.

The contact hole 540 exposing a portion of the doped layer 145 may be formed in the first buffer layer 111a, the first insulating layer 115a, the second insulating layer 115b, the third insulating layer 115c, the first and second planarization layers 115d and 115e, the bank 115f, and the substrate 110. The contact hole 540 may penetrate the first buffer layer 111a, the first insulating layer 115a, the second insulating layer 115b, the third insulating layer 115c, the first and second planarization layers 115d and 115e, the bank 115f, and the substrate 110 to expose a portion of the doped layer 145.

A light emitting element including the first electrode, the light emitting unit, and the second electrode 533 may be disposed in the display area. Also, the second electrode 533 of the display area may extend on the bank 115f in the non-display area.

The second electrode 533 may extend to the non-display area and be electrically connected to the doped layer (or conductive layer) 145 of the second buffer layer 111b. That is, the second electrode 533 extending through the plurality of contact holes 540 may be electrically connected to the doped layer (or conductive layer) 145 of the second buffer layer 111b, and at the same time, may also be connected (or grounded) to the low-potential power supply line.

The second electrode 533 may be connected to the pads 155, that is, the low-potential power supply pad, for example, in a rectangular shape.

The second electrode 533 may be formed of a metallic material having high conductivity.

The second electrode 533 may be formed to overlap a portion of the non-display area as well as the display area.

The encapsulation part 115h may be disposed on the second electrode 533.

Meanwhile, as described above, the doped layer of the present disclosure may be selectively formed only within the contact hole, which will be described in detail with reference to FIGS. 12 and 13.

Figure 12:
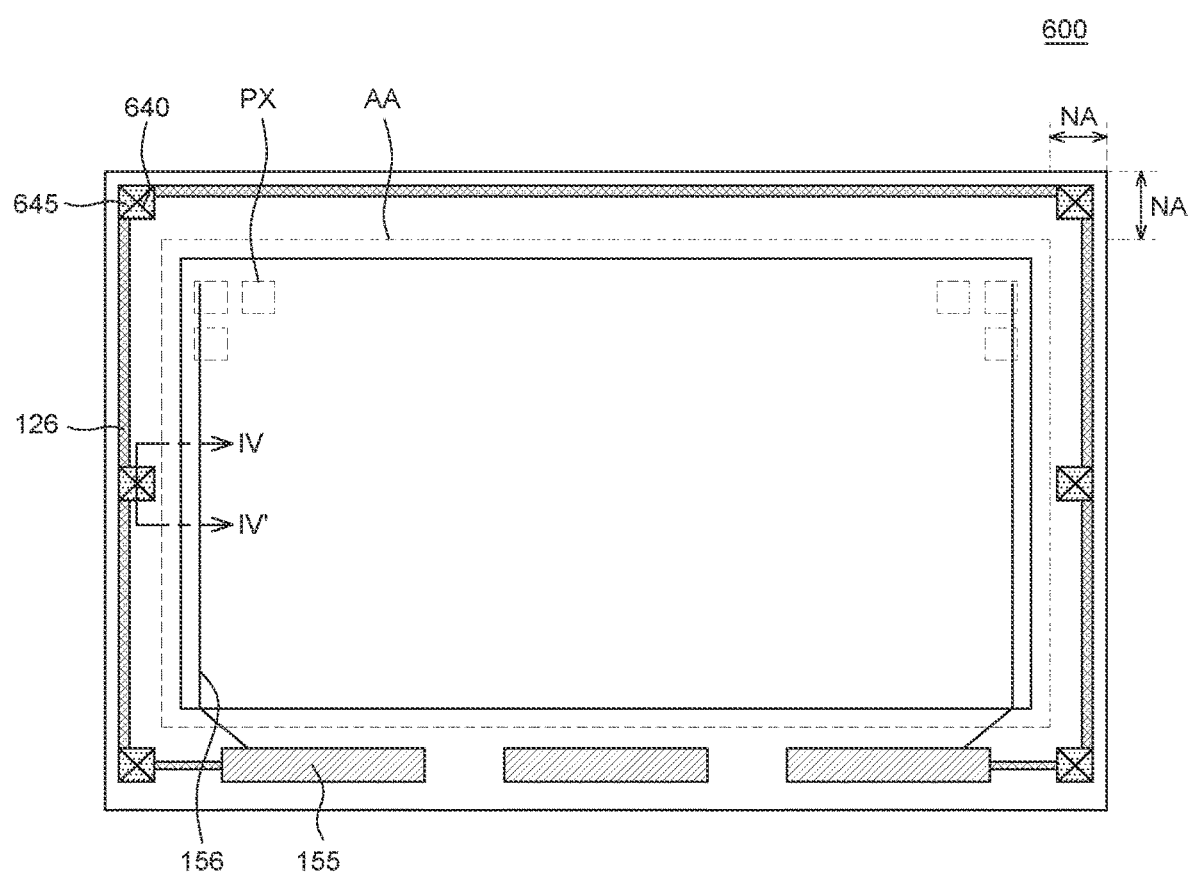
FIG. 12 is a plan view of a flexible display device according to a sixth exemplary embodiment of the present disclosure.

FIG. 12 is a plan view of a flexible display device according to a sixth exemplary embodiment of the present disclosure.

Figure 13:
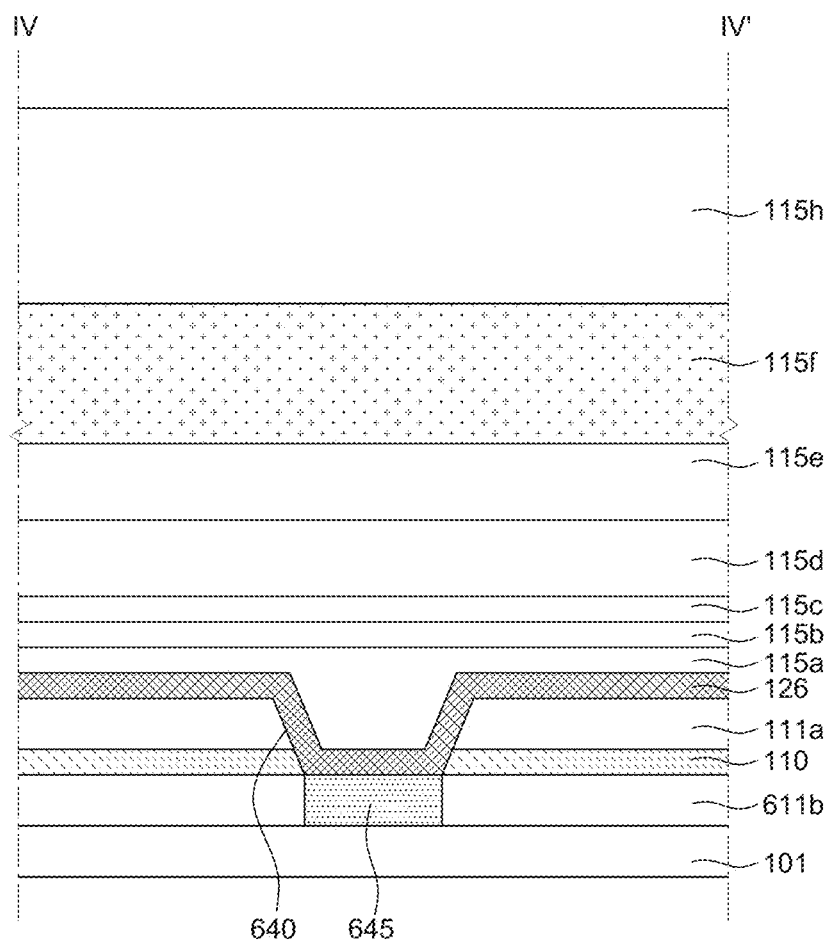
FIG. 13 is a cross-sectional view taken along line IV-IV' of FIG. 12.

FIG. 13 is a cross-sectional view taken along line IV-IV' of FIG. 12.

FIG. 13 shows a detailed structure of a non-display area NA described with reference to FIG. 12.

With reference to FIG. 12, a flexible display device 600 according to the sixth exemplary embodiment of the present disclosure includes a display area AA and a non-display area NA.

For convenience, the non-display area NA may be defined as an area excluding the display area AA, and a description of reference numeral thereof will be omitted.

The display area AA may be disposed in the center of the display panel, and may be an area where an image is displayed in the flexible display device 600.

The display area AA may include a plurality of sub-pixels PX.

The non-display area NA corresponds to the edge area of the display panel, and may be an area where an image is not displayed. The non-display area NA may be disposed to surround the display area AA.

The non-display area NA includes a pad area. For example, the pad area may be disposed at a lower end portion of the display panel. The pad area may include the plurality of pads 155 and signal lines connected to the plurality of pads 155. A driver IC, a driving circuit, or a flexible film may be connected to the pad area through the plurality of pads 155. The driver IC, the driving circuit, or the flexible film may transmit various driving signals, a low-potential voltage, and a high-potential voltage to the plurality of pads 155.

The plurality of pads 155 receive various driving signals for driving the flexible display device 600 and supply them to components of the flexible display device 600 such as the plurality of sub-pixels PX, whereby the flexible display device 600 can be driven.

The plurality of pads 155 include a data pad for supplying a data signal to each of the plurality of sub-pixels PX, a high-potential power supply pad for supplying a high-potential voltage to the first electrode of the light emitting element, and a low-potential power supply pad for supplying a low-potential voltage to the second electrode of the light emitting element.

In addition, the connection line 126 may be electrically connected to the low-potential power supply pad.

The connection line 126 may be electrically connected to a doped layer (or conductive layer) 645 of a lower buffer layer. That is, the connection line 126 is electrically connected to the doped layer 645 of the lower buffer layer through a plurality of contact holes 640 and at the same time, may be connected (or grounded) to the low-potential power supply line.

The connection line 126 may be connected to the pads 155, that is, the low-potential power supply pad, in a quadrangular frame shape.

The connection line 126 may be formed of a metallic material having high conductivity. The connection line 126 may be composed of a light blocking pattern of the display area AA, the electrodes of the transistor, or the first electrode or the second electrode of the light emitting element.

The doped layer 645 may be formed in the second buffer layer in a region corresponding to the contact hole 640 under the polyimide substrate.

The doped layer 645 may be formed by selectively doping the second buffer layer.

For ground, the contact hole 640 exposing the doped layer 645 of the second buffer layer through the polyimide substrate is formed in the edge area of the display panel, and the connection line 126 may be electrically connected to the doped layer 645 of the second buffer layer through the contact hole 640.

The contact hole 640 may be at least one contact hole. FIG. 12 shows an example in which a total of six contact holes 640 are provided at four corners of the display panel and between the corners, but the number of contact holes 640 in the present disclosure is not limited thereto.

Also, the high-potential power supply line 156 may be electrically connected to the high-potential power supply pad. In this case, the high-potential power supply line 156 may be a second power supply line.

With reference to FIG. 13, the substrate 110 may be disposed to support and protect various components of the flexible display device.

The substrate 110 may be formed of a plastic material having flexibility. When the substrate 110 is formed of a plastic material, for example, it may be formed of polyimide, but is not limited thereto.

A second buffer layer 611b may be disposed under the substrate 110.

The support substrate 101 formed of glass may be disposed under the second buffer layer 611b.

In order to improve luminance defects in the edge area of the display panel due to charging of the polyimide substrate 110, the doped layer (or conductive layer) 645 may be formed in the second buffer layer 611b under the substrate 110.

The doped layer 645 may be formed by selectively doping the second buffer layer 611b.

The doped layer 645 may be selectively formed only within the contact hole 640. That is, when forming the contact hole 640, the doped layer 645 may be selectively formed only within the contact hole 640 through doping. Alternatively, the doped layer 645 may be formed in a portion of the second buffer layer 611b in a region where the contact hole 640 is to be formed.

As impurity ions used for doping, a p-type impurity or an n-type impurity may be used. The p-type impurity may be one of boron (B), aluminum (Al), gallium (Ga), and indium (In), and the n-type impurity may be one of phosphorus (P), arsenic (As), and antimony (Sb). However, the present disclosure is not limited thereto.

Instead of doping using impurity ions, a metal layer may be additionally formed on or inside the second buffer layer 611b. An inner metal layer may be composed of a conductive metal such as copper (Cu), aluminum (Al), chromium (Cr), gold (Au), molybdenum (Mo), titanium (Ti), and nickel (Ni), or may be composed of a transparent conductive material such as indium tin oxide (ITO), indium zinc oxide (IZO), or the like.

Meanwhile, the first buffer layer 111a may be disposed on the substrate 110.

The contact hole 640 exposing a portion or the entirety of the doped layer 645 may be formed in the first buffer layer 111a and the substrate 110 in the non-display area NA. That is, the contact hole 640 may penetrate the first buffer layer 111a and the substrate 110 to expose a portion or the entirety of the doped layer 645.

A connection line 126 may be disposed on the first buffer layer 111a in the non-display area NA.

The connection line 126 may be connected to the low-potential power supply pad, for example, in a quadrangular frame shape. However, the present disclosure is not limited thereto.

The connection line 126 may be formed of a light blocking pattern of the display area, the electrodes of the transistor, or the first electrode or the second electrode of the light emitting element.

FIG. 13 illustrates an example in which the connection line 126 is formed of a conductive material constituting the light blocking pattern when the light blocking pattern is formed in the display area, but the present disclosure is not limited thereto.

The connection line 126 may be electrically connected to the doped layer 645 of the second buffer layer 611b through the contact hole 640.

The first insulating layer 115a may be disposed on the connection line 126.

Components provided on the first insulating layer 115a are substantially the same as and similar to components described in FIG. 4, and thus, descriptions thereof will be omitted.

The flexible display devices according to the first to sixth exemplary embodiments of the present disclosure described above may be applied to a rollable display device, and hereinafter, the rollable display device will be described in detail.

Figure 14A:
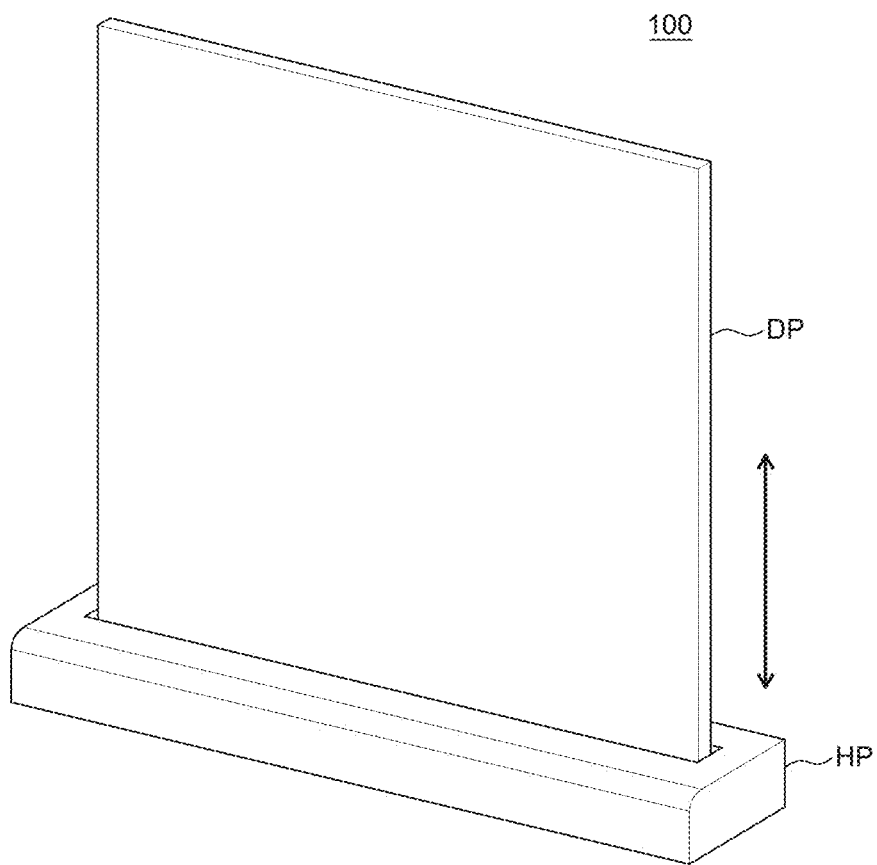
FIGS. 14A and 14B are perspective views of the flexible display device according to the present disclosure.
Figure 14B:
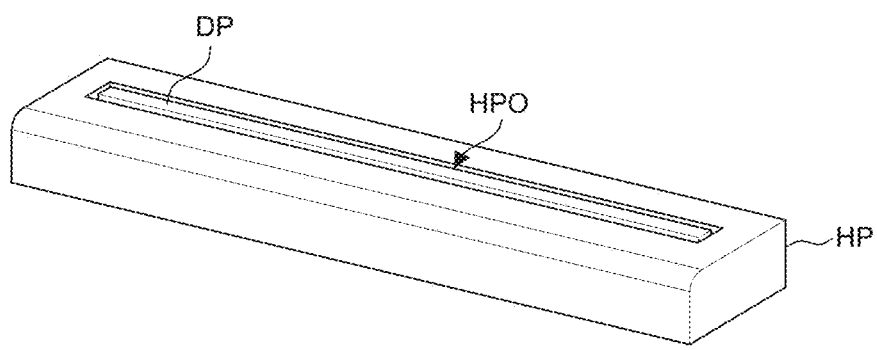

FIGS. 14A and 14B are perspective views of the flexible display device according to the present disclosure.

That is, FIGS. 14A and 14B illustrate a rollable display device as a flexible display device, by way of example, but the present disclosure is not limited thereto.

The rollable display device may also be referred to as a display device capable of displaying an image even when the display device is rolled. The rollable display device may have a high flexibility as compared to a general display device of the related art. Depending on whether the rollable display device is in use or not, a shape of the rollable display device may be freely varied. Specifically, when the rollable display device is not in use, the rollable display device can be rolled to be stored with a reduced volume. In contrast, when the rollable display device is in use, the rolled rollable display device can be unrolled to be used.

With reference to FIGS. 14A and 14B, the display device 100 according to the exemplary embodiment of the present disclosure includes a display part DP and a housing part HP.

The display part DP is configured to display images to a user. For example, display elements, circuits for driving the display elements, lines, and other components may be disposed in the display part DP.

The display device 100 according to the exemplary embodiment of the present disclosure is a rollable display device. Therefore, the display part DP may be configured to be wound and unwound. For example, the display part DP may include a display panel and a back cover which are flexible so that they can be wound or unwound.

The housing part HP serves as a case where the display part DP can be accommodated. The display part DP may be wound and then, accommodated within the housing part HP, and the display part DP may be unwound and then, may be disposed outside the housing part HP.

The housing part HP includes an opening HPO through which the display part DP can move in and out of the housing part HP. The display part DP can move in a vertical direction through the opening HPO of the housing part HP.

Meanwhile, the display part DP can transition from a full unwinding state to a full winding state, or vice versa.

FIG. 14A shows a full unwinding state of the display part DP of the display device 100. The full unwinding state refers to a state in which the display part DP of the display device 100 is disposed outside the housing part HP. That is, the full unwinding state can be defined as a state in which the display part DP is unwound and disposed maximally outside the housing part HP in order for a user to view images on the display device 100. And, in the full unwinding state, the display part DP can no longer be unwound.

FIG. 14B shows a full winding state of the display part DP of the display device 100. The full winding state refers to a state in which the display part DP of the display device 100 is accommodated within the housing part HP and can no longer be wound. That is, the full winding state can be defined as a state in which the display part DP is wound and accommodated within the housing part HP when the user does not view images on the display device 100 because it is preferable not to dispose the display part DP in the outside of the housing part HP in terms of external appearance. Further, in the full winding state in which the display part DP is accommodated within the housing part HP, the display device 100 is reduced in volume and facilitated to be transported.

Meanwhile, a driving part for winding or unwinding the display part DP to switch the display part DP to the full unwinding state or the full winding state may be disposed.

In the rollable display device according to the exemplary embodiment of the present disclosure configured as above, a doped layer (or conductive layer) is formed in a lower buffer layer in an edge area of a display panel, and is connected (grounded) to a low-potential power supply line through a contact hole, whereby charges accumulated in a polyimide substrate can be removed, thereby minimizing luminance unevenness of the display panel due to the use of the polyimide substrate.

The exemplary embodiments of the present disclosure can also be described as follows:

According to an aspect of the present disclosure, there is provided a flexible display device. The flexible display device includes a substrate divided into a display area and a non-display area, a first buffer layer disposed on the substrate, a second buffer layer disposed under the substrate, a support member disposed under the second buffer layer, a transistor and a light emitting element disposed above the first buffer layer in the display area, a conductive layer disposed in the second buffer layer in the non-display area and a connection member disposed on the first buffer layer in the non-display area and electrically connected to the conductive layer through a contact hole.

The substrate may be made of polyimide (PI).

The support member may be made of etched glass.

The support member may include an auxiliary substrate made of polyimide and a protective film under the auxiliary substrate.

The transistor may include a gate electrode, an active layer, a source electrode, and a drain electrode, and the connection member may be made of a conductive material constituting the gate electrode or the source/drain electrode on the same layer as the gate electrode or the source/drain electrode.

The flexible display device may further include a light blocking pattern disposed under the active layer, wherein the connection member may be made of a conductive material constituting the light blocking pattern on the same layer as the light blocking pattern.

The flexible display device may further include a pad disposed on the substrate in the non-display area.

The connection member may have a quadrangular frame shape and may be disposed over three sides of the non-display area, excluding a lower portion thereof.

The connection member may extend to the pad in the lower portion of the non-display area to thereby be electrically connected to the pad.

The conductive layer may overlap the non-display area and a portion of the display area, in a quadrangular frame shape.

The conductive layer may be made of a layer doped in the contact hole.

The conductive layer may be made of a layer doped in the second buffer layer.

The contact hole may be disposed in the first buffer layer and the substrate to expose the conductive layer of the second buffer layer.

The connection member may be made of a second electrode of the light emitting element.

The second electrode may extend to the non-display area to overlap a portion of the conductive layer.

The connection member may overlap the display area and a portion of the non-display area, in a rectangular shape.

The second buffer layer may be composed of a second upper buffer layer and a second lower buffer layer, wherein the conductive layer may be made of a metal layer disposed between the second upper buffer layer and the second lower buffer layer.

According to another aspect of the present disclosure, there is provided a flexible display device. The flexible display device includes a substrate divided into a display area and a non-display area, a first buffer layer disposed on the substrate, a second buffer layer disposed under the substrate, a support member disposed under the second buffer layer, a transistor and a light emitting element disposed above the first buffer layer in the display area, a conductive layer disposed in the second buffer layer in the non-display area and a connection member connected to the conductive layer through a contact hole, wherein the substrate is made of polyimide, and the connection member removes charges accumulated in the substrate of polyimide through ground.

It will be apparent to those skilled in the art that various modifications and variations can be made in the flexible display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A flexible display device, comprising:
   a substrate divided into a display area and a non-display area;
   a first buffer layer disposed on the substrate;
   a second buffer layer disposed under the substrate;
   a support member disposed under the second buffer layer;
   a transistor and a light emitting element disposed above the first buffer layer in the display area;
   a conductive layer disposed in the second buffer layer in the non-display area; and
   a connection member disposed on the first buffer layer in the non-display area and electrically connected to the conductive layer through a contact hole.

2. The flexible display device of claim 1, wherein the substrate is made of polyimide (PI).

3. The flexible display device of any of claims 1 and 2, wherein the support member is made of etched glass.

4. The flexible display device of any of claims 1 and 2, wherein the support member includes,
   an auxiliary substrate made of polyimide; and
   a protective film under the auxiliary substrate.

5. The flexible display device of claim 1, wherein the transistor includes a gate electrode, an active layer, a source electrode, and a drain electrode, and
   the connection member is made of a conductive material constituting the gate electrode or the source/drain electrode on the same layer as the gate electrode or the source/drain electrode.

6. The flexible display device of claim 5, further comprising: a light blocking pattern disposed under the active layer of the transistor,
   wherein the connection member is made of a conductive material constituting the light blocking pattern on the same layer as the light blocking pattern.

7. The flexible display device of claim 1, further comprising: a pad disposed on the substrate in the non-display area.

8. The flexible display device of claim 7, wherein the connection member has a quadrangular frame shape and is disposed over three sides of the non-display area, excluding a lower portion thereof.

9. The flexible display device of claim 8, wherein the connection member extends to the pad in the lower portion of the non-display area to thereby be electrically connected to the pad.

10. The flexible display device of claim 1, wherein the conductive layer overlaps the non-display area and a portion of the display area, in a quadrangular frame shape.

11. The flexible display device of claim 1, wherein the conductive layer is made of a layer doped in the contact hole.

12. The flexible display device of claim 1, wherein the conductive layer is made of a layer doped in the second buffer layer.

13. The flexible display device of claim 1, wherein the contact hole is disposed in the first buffer layer and the substrate to expose the conductive layer of the second buffer layer.

14. The flexible display device of claim 1, wherein the connection member is made of a second electrode of the light emitting element.

15. The flexible display device of claim 14, wherein the second electrode extends to the non-display area to overlap a portion of the conductive layer.

16. The flexible display device of claim 14, wherein the connection member overlaps the display area and a portion of the non-display area, in a rectangular shape.

17. The flexible display device of claim 1, wherein the second buffer layer is composed of a second upper buffer layer and a second lower buffer layer, wherein the conductive layer is made of a metal layer disposed between the second upper buffer layer and the second lower buffer layer.

18. A flexible display device, comprising:
a substrate divided into a display area and a non-display area;
a first buffer layer disposed on the substrate;
a second buffer layer disposed under the substrate;
a support member disposed under the second buffer layer;
a transistor and a light emitting element disposed above the first buffer layer in the display area;
a conductive layer disposed in the second buffer layer in the non-display area; and
a connection member connected to the conductive layer through a contact hole,
wherein the substrate is made of polyimide, and the connection member removes charges accumulated in the substrate of polyimide through ground.

* * * * *